US012684826B2

(12) United States Patent
Su et al.

(10) Patent No.: US 12,684,826 B2
(45) Date of Patent: Jul. 14, 2026

(54) AVALANCHE-PROTECTED TRANSISTORS USING A BOTTOM BREAKDOWN CURRENT PATH AND METHODS OF FORMING THE SAME

(71) Applicant: Taiwan Semiconductor Manufacturing Company Limited, Hsinchu (TW)

(72) Inventors: Liang-Yu Su, Yunlin County (TW); Hung-Chih Tsai, Daliao Township (TW); Ruey-Hsin Liu, Hsinchu (TW); Ming-Ta Lei, Hsinchu City (TW); Chang-Tai Yang, Taipei City (TW); Te-Yin Hsia, Taipei (TW); Yu-Chang Jong, Hsinchu City (TW); Nan-Ying Yang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 943 days.

(21) Appl. No.: 17/867,843

(22) Filed: Jul. 19, 2022

(65) Prior Publication Data
US 2022/0367614 A1      Nov. 17, 2022

Related U.S. Application Data

(62) Division of application No. 16/989,962, filed on Aug. 11, 2020, now Pat. No. 11,437,466.

(51) Int. Cl.
| | |
|---|---|
| *H10D 30/01* | (2025.01) |
| *H10D 30/60* | (2025.01) |
| *H10D 62/10* | (2025.01) |

(52) U.S. Cl.
CPC ....... *H10D 62/108* (2025.01); *H10D 30/0221* (2025.01); *H10D 30/603* (2025.01); *H10D 62/126* (2025.01)

(58) Field of Classification Search
CPC . H10D 62/108; H10D 30/0221; H10D 30/603
See application file for complete search history.

(56) References Cited

U.S. PATENT DOCUMENTS

| | | | | |
|---|---|---|---|---|
| 4,929,991 | A | 5/1990 | Blanchard | |
| 5,156,989 | A * | 10/1992 | Williams | ............. H10D 84/038 |
| | | | | 257/370 |

(Continued)

FOREIGN PATENT DOCUMENTS

| | | |
|---|---|---|
| CN | 101540339 A | 9/2009 |
| CN | 104201203 A | 12/2014 |

(Continued)

OTHER PUBLICATIONS

TW Patent and Trademark Office, TW Application No. 110101530 , Office Action dated May 24, 2022, 11 pages.

(Continued)

*Primary Examiner* — Eugene Lee
(74) *Attorney, Agent, or Firm* — The Marbury Law Group, PLLC

(57) ABSTRACT

An avalanche-protected field effect transistor includes, within a semiconductor substrate, a body semiconductor layer and a doped body contact region having a doping of a first conductivity type, and a source region a drain region having a doping of a second conductivity type. A buried first-conductivity-type well may be located within the semiconductor substrate. The buried first-conductivity-type well underlies, and has an areal overlap in a plan view with, the drain region, and is vertically spaced apart from the drain region, and has a higher atomic concentration of dopants of the first conductivity type than the body semiconductor layer. The configuration of the field effect transistor induces more than 90% of impact ionization electrical charges during avalanche breakdown to flow from the source region, (Continued)

to pass through the buried first-conductivity-type well, and to impinge on a bottom surface of the drain region.

20 Claims, 36 Drawing Sheets

(56) References Cited

U.S. PATENT DOCUMENTS

| | | | |
|---|---|---|---|
| 5,374,843 A | | 12/1994 | Williams et al. |
| 5,591,662 A | * | 1/1997 | Zambrano ............ H10D 84/038 |
| | | | 438/220 |
| 5,701,023 A | | 12/1997 | Bulucea et al. |
| 6,452,236 B1 | | 9/2002 | Nadakumar et al. |
| 6,831,332 B2 | * | 12/2004 | D'Anna ............... H10D 30/603 |
| | | | 257/E29.268 |
| 7,514,754 B2 | * | 4/2009 | Ma ..................... H10D 84/0191 |
| | | | 257/370 |
| 7,592,683 B2 | * | 9/2009 | Iwabuchi ............. H10D 62/378 |
| | | | 257/487 |
| 7,649,225 B2 | | 1/2010 | Cai et al. |
| 7,994,567 B2 | * | 8/2011 | Miyake .................. H10D 84/83 |
| | | | 257/341 |
| 8,004,040 B2 | * | 8/2011 | Ichijo ..................... H10D 30/65 |
| | | | 257/E29.12 |
| 9,299,831 B2 | * | 3/2016 | Matsuda .............. H10D 62/371 |
| 9,461,046 B1 | * | 10/2016 | Edwards .............. H10D 62/151 |
| 10,461,182 B1 | | 10/2019 | Edwards et al. |
| 11,152,505 B2 | | 10/2021 | Sadovnikov et al. |

| | | | |
|---|---|---|---|
| 2002/0167088 A1 | * | 11/2002 | Hoshino ............ H10D 84/0149 |
| | | | 257/E29.268 |
| 2007/0138548 A1 | | 6/2007 | Kocon et al. |
| 2009/0140335 A1 | * | 6/2009 | Schneider ............ H10D 30/611 |
| | | | 257/344 |
| 2011/0039387 A1 | * | 2/2011 | Wei ..................... H10D 30/0221 |
| | | | 438/289 |
| 2011/0215373 A1 | * | 9/2011 | Kwon .................. H10D 84/151 |
| | | | 257/E29.198 |
| 2013/0285113 A1 | | 10/2013 | Edwards et al. |
| 2014/0035102 A1 | | 2/2014 | Korec at al. |
| 2014/0246719 A1 | | 9/2014 | Dhaoui et al. |
| 2015/0295081 A1 | * | 10/2015 | Matsuda ............ H10D 30/0221 |
| | | | 257/339 |
| 2015/0371985 A1 | | 12/2015 | Edwards et al. |
| 2017/0179260 A1 | | 6/2017 | Edwards et al. |
| 2020/0365727 A1 | * | 11/2020 | Kocon ................. H10D 62/154 |

FOREIGN PATENT DOCUMENTS

| | | |
|---|---|---|
| CN | 104769715 A | 7/2015 |
| CN | 106898650 A | 6/2017 |

OTHER PUBLICATIONS

CN Patent and Trademark Office; CN Application No. 202110069074.0; Office Action mailed Apr. 22, 2025; 30 pages.

Jianq Chyun Intellectual Property Office; CN Application No. 202110069074.0; Office Action mailed Sep. 11, 2024; 30 pages.

* cited by examiner

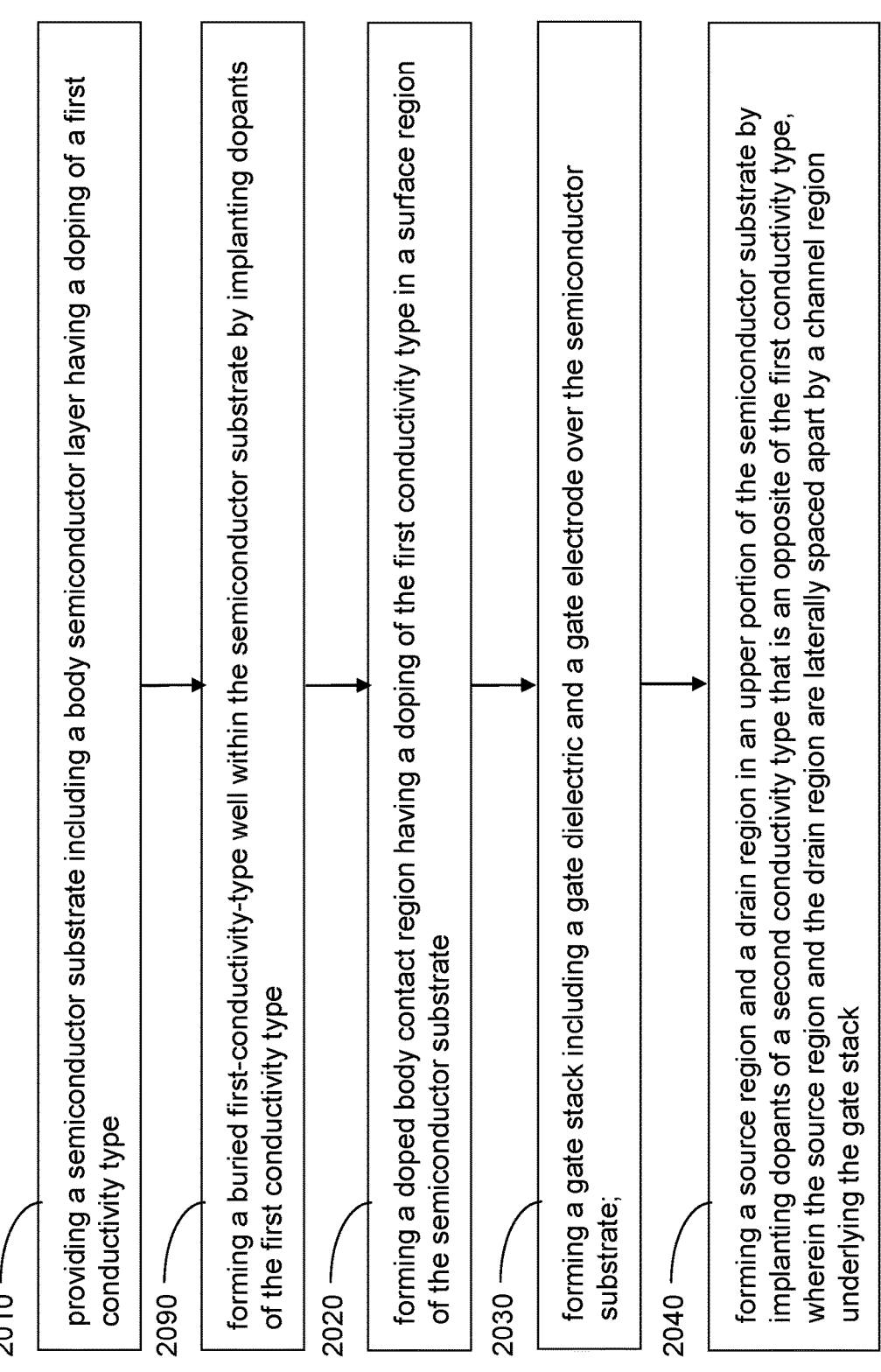

FIG. 20A

2010 — providing a semiconductor substrate including a body semiconductor layer having a doping of a first conductivity type 2090 — forming a buried first-conductivity-type well within the semiconductor substrate by implanting dopants of the first conductivity type 2020 — forming a doped body contact region having a doping of the first conductivity type in a surface region of the semiconductor substrate 2030 — forming a gate stack including a gate dielectric and a gate electrode over the semiconductor substrate;

2040 — forming a source region and a drain region in an upper portion of the semiconductor substrate by implanting dopants of a second conductivity type that is an opposite of the first conductivity type, wherein the source region and the drain region are laterally spaced apart by a channel region underlying the gate stack

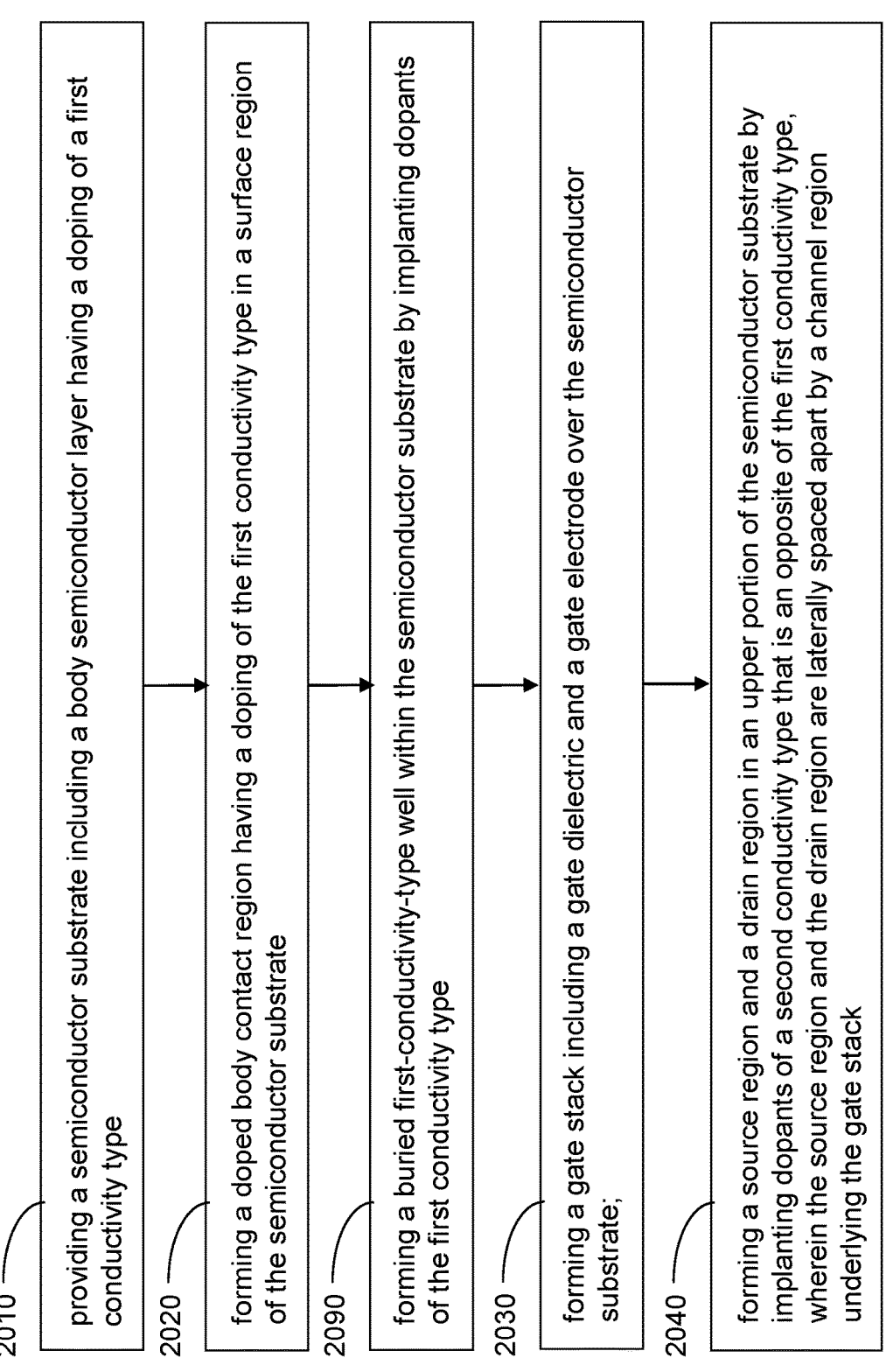

2010 — providing a semiconductor substrate including a body semiconductor layer having a doping of a first conductivity type 2020 — forming a doped body contact region having a doping of the first conductivity type in a surface region of the semiconductor substrate 2090 — forming a buried first-conductivity-type well within the semiconductor substrate by implanting dopants of the first conductivity type 2030 — forming a gate stack including a gate dielectric and a gate electrode over the semiconductor substrate;

2040 — forming a source region and a drain region in an upper portion of the semiconductor substrate by implanting dopants of a second conductivity type that is an opposite of the first conductivity type, wherein the source region and the drain region are laterally spaced apart by a channel region underlying the gate stack

FIG. 20B

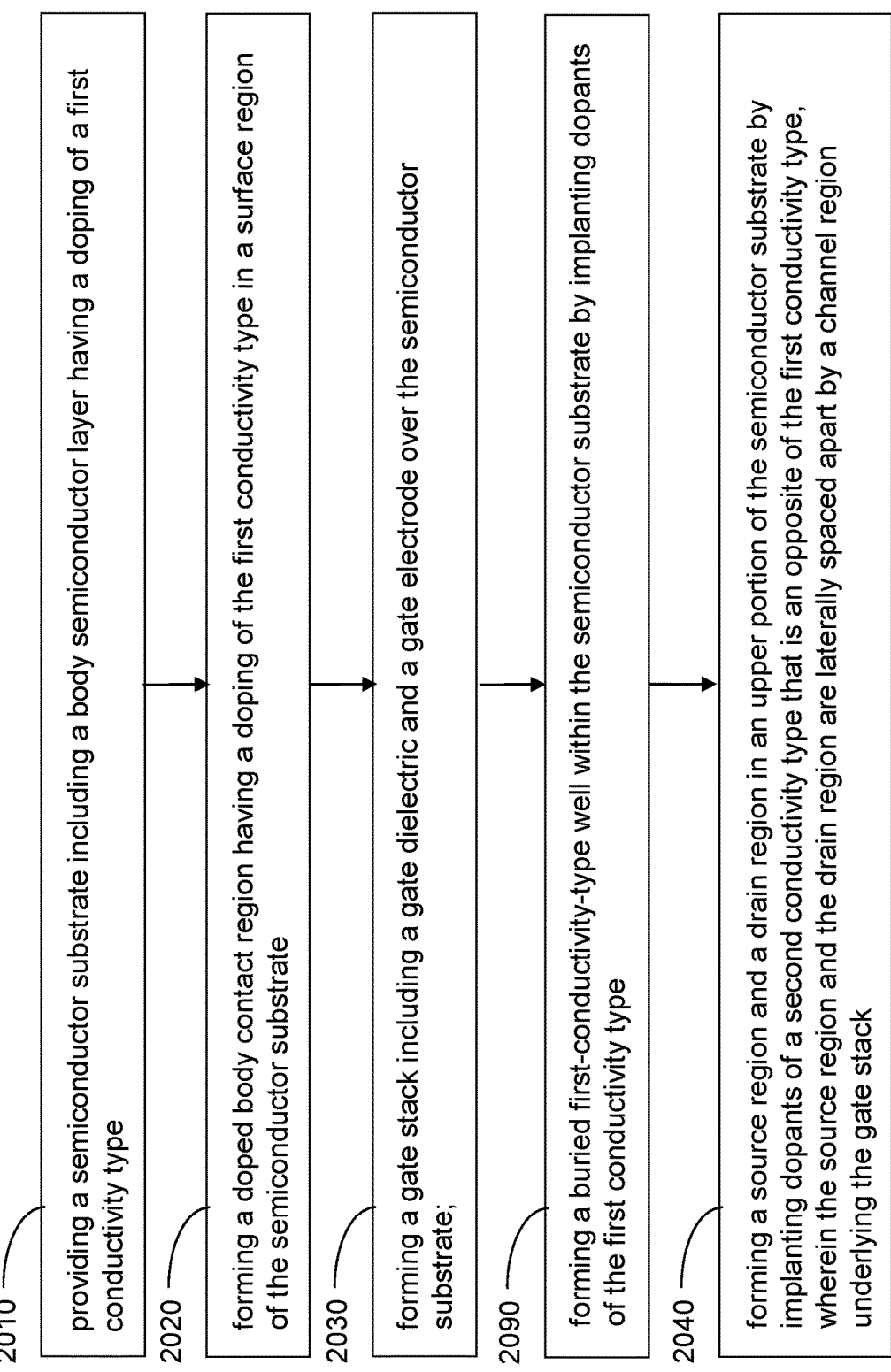

2010 — providing a semiconductor substrate including a body semiconductor layer having a doping of a first conductivity type 2020 — forming a doped body contact region having a doping of the first conductivity type in a surface region of the semiconductor substrate 2030 — forming a gate stack including a gate dielectric and a gate electrode over the semiconductor substrate;

2090 — forming a buried first-conductivity-type well within the semiconductor substrate by implanting dopants of the first conductivity type 2040 — forming a source region and a drain region in an upper portion of the semiconductor substrate by implanting dopants of a second conductivity type that is an opposite of the first conductivity type, wherein the source region and the drain region are laterally spaced apart by a channel region underlying the gate stack

FIG. 20C

AVALANCHE-PROTECTED TRANSISTORS USING A BOTTOM BREAKDOWN CURRENT PATH AND METHODS OF FORMING THE SAME

RELATED APPLICATIONS

This application is a divisional application of U.S. application Ser. No. 16/989,962 entitled "Avalanche Protected Transistors Using a Bottom Breakdown Current Path and Methods of Forming the Same," filed on Aug. 11, 2020, the entire contents of which are incorporated herein by reference for all purposes.

BACKGROUND

For power applications such as automotive applications and voltage regulator module (VRM) applications, parasitic voltages in a power loop or inductive circuits may cause significant voltage spikes and/or ringing. Devices may enter into an avalanche mode during switching cycles, and may suffer from performance degradation caused by damage that avalanches of electrical charges cause at the structural level. In order to prevent such damages to the devices during avalanche breakdowns, a power device needs to provide ruggedness under unclamped inductive switching (UIS) events. To maintain circuit performance and to prevent functional failures of a power semiconductor device during its lifetime, high single pulse avalanche energy ($E_{AS}$) and high repetitive avalanche energy ($E_{AR}$) are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20A is a first flow chart illustrating steps for forming an avalanche-protected field effect transistor of the present disclosure according to an embodiment of the present disclosure.

FIG. 20B is a second flow chart illustrating steps for forming an avalanche-protected field effect transistor of the present disclosure according to an embodiment of the present disclosure.

FIG. 20C is a third flow chart illustrating steps for forming an avalanche-protected field effect transistor of the present disclosure according to an embodiment of the present disclosure.

DETAILED DESCRIPTION

Figure 1A:
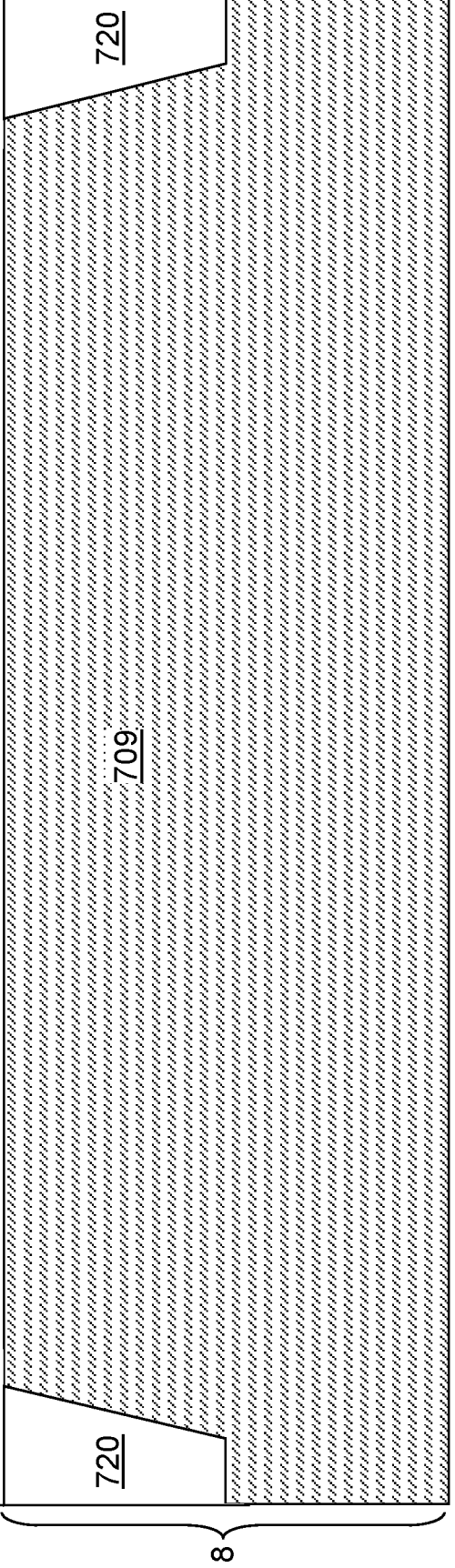
FIG. 1A is a vertical cross-sectional view of a first exemplary structure after formation of shallow trench isolation structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless expressly indicated otherwise, elements with the same reference numeral are presumed to have the same material composition and the same thickness range.

The present disclosure is directed to generally to semiconductor devices, and specifically to avalanche-protected transistors using a bottom breakdown current path and methods of forming the same.

In power applications for semiconductor devices, parasitic inductance may induce high voltage overshoot and cause degradation of on-current in the semiconductor device. For example, reduction on the order of 10% in the on-current is typically observed after 100 hours of stress under voltage overshoot conditions. The cause of the on-current degradation may be due to impact ionization that occurs at a drain-side edge of a gate dielectric during charge carrier avalanche events. Embodiments of the present disclosure provide semiconductor structures with built-in protection of a gate dielectric from avalanche breakdowns. The embodiment semiconductor structures of the present disclosure may provide superior reliability without performance degradation or with minimal performance degradation under high voltage, high current, and/or high speed switching conditions.

For example, a buried doped well may be formed within a field effect transistor (FET) by ion implantation of electrical dopants having a same conductivity type as the body region of the field effect transistor. Such a field effect transistor with buried doped well may have a configuration that induces breakdown at the bottom of the drain region instead of a breakdown at a sidewall of the drain region. The buried doped well functions like a Zener diode. The drain region forms a p-n junction with an underlying semiconductor material portion that overlies the buried doped well. The underlying semiconductor material portion may be a body semiconductor layer or a buried well extension region.

The avalanche breakdown path provided at the bottom of the drain region may increase the single pulse avalanche energy ($E_{AS}$) and the repetitive avalanche energy ($E_{AR}$) that the field effect transistor may absorb during voltage swings. The buried doped well may be formed by a global bottom breakdown implant, or by a localized bottom breakdown implant. The various aspects of embodiments of the present disclosure are described in detail herebelow.

Referring to FIG. 1A, a first exemplary structure according to an embodiment of the present disclosure is illustrated, which includes a semiconductor substrate 8. At least the upper portion of the semiconductor substrate 8 includes a semiconductor material layer having a doping of a first conductivity type, which is subsequently used to form a body region of a field effect transistor, and is herein referred to as a body semiconductor layer 709. The semiconductor substrate 8 may be a bulk substrate including a semiconductor material throughout, such as a commercially available single crystalline silicon substrate having a thickness in a range from 500 microns to 1 mm.

Shallow trenches may be formed through a front surface (i.e., a top surface) of the semiconductor substrate 8. For example, a photoresist layer may be applied over the front surface of the semiconductor substrate 8, and may be lithographically patterned to cover each device region. The device region may be a respective portion of the body semiconductor layer 709 that may be subsequently used to form a semiconductor device such as a field effect transistor. An etch process, such as a reactive ion etch process, may be performed to recess unmasked portions of the semiconductor substrate 8, thereby forming shallow trenches that protrude downward from the horizontal plane including the top surface of the semiconductor substrate 8. The shallow trenches may laterally surround upper portions of the semiconductor substrate 8 in which a respective semiconductor device may be subsequently formed. At least one dielectric material, such as silicon oxide, may be deposited in the shallow trenches. Excess portions of the at least one dielectric material may be removed from above the horizontal plane including the top surface of the semiconductor substrate 8. For example, a chemical mechanical planarization (CMP) process may be used to remove the excess portions of the at least one dielectric material. Remaining portions of the at least one dielectric material that fill the shallow trenches comprise shallow trench isolation structures 720. The depth of the shallow trench isolation structures 720 may be in a range from 80 nm to 800 nm, such as from 160 nm to 400 nm, although lesser and greater depths may also be used.

The body semiconductor layer 709 may have a doping of the first conductivity type, which may be p-type or n-type. The body semiconductor layer 709 may have the same level of doping as an initial semiconductor substrate as provided, or may have a different level of doping that may be adjusted by implantation of dopants of the first conductivity type or by epitaxial deposition of a doped semiconductor material. In one embodiment, the body semiconductor layer 709 may have a uniform dopant concentration throughout. In an illustrative example, the body semiconductor layer 709 may include dopants of the first conductivity type at an atomic concentration in a range from $1.0 \times 10^{14}/cm^3$ to $3.0 \times 10^{17}/cm^3$, such as from $1.0 \times 10^{15}/cm^3$ to $1.0 \times 10^{17}/cm^3$.

Figure 1B:
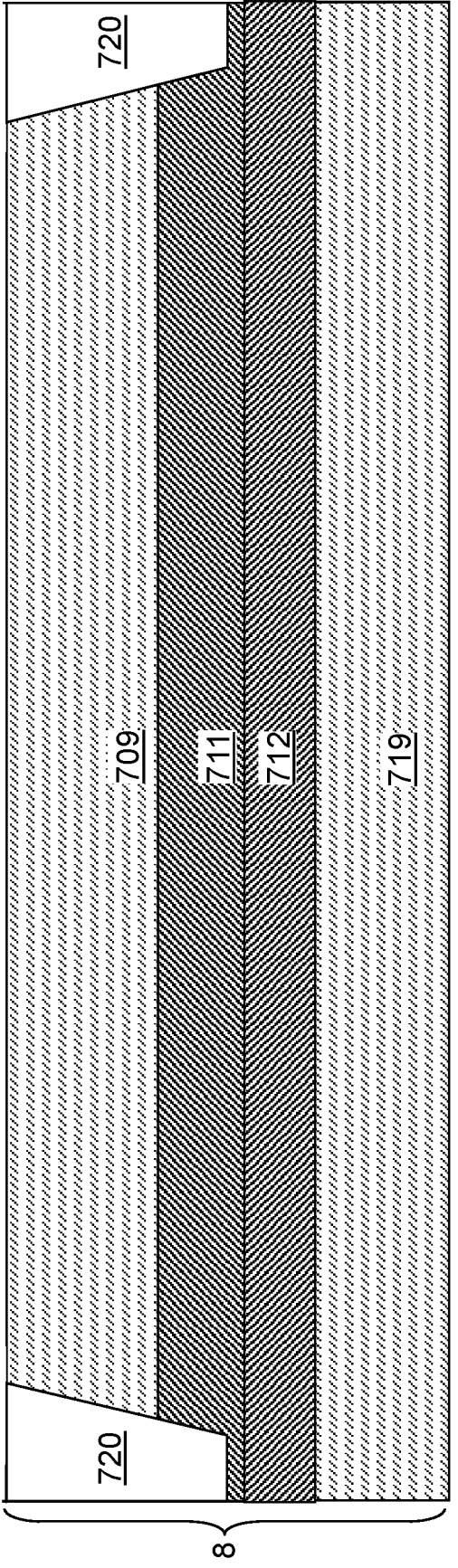
FIG. 1B is a vertical cross-sectional view of the first exemplary structure after formation of a buried first-conductivity-type well and a buried second-conductivity-type well according to an embodiment of the present disclosure.

Referring to FIG. 1B, a buried well of a first-conductivity-type 711 and a buried well of a second-conductivity-type 712 may be formed by performing ion implantation processes. The buried first-conductivity-type well 711 may be formed in a first blanket ion implantation process, i.e., an implantation that does not use an implantation mask. The first blanket ion implantation process may implant dopants of the first conductivity type to an implantation depth that is located at about the depth of the bottom surface of the shallow trench isolation structures 720. Due to the stochastic nature of the depth of the implanted dopants of the first conductivity type, the buried first-conductivity-type well 711 may be formed with a finite thickness. This finite thickness may be in a range from 20 nm to 600 nm, such as from 40 nm to 300 nm. The interface between the buried first-conductivity-type well 711 and the body semiconductor layer 709 may be defined as a contour line at which the atomic concentration of dopants of the first conductivity type is at 200% of the average atomic concentration of the dopants of the first conductivity type in the body semiconductor layer 709 prior to the first blanket ion implantation process. The planar interface between the body semiconductor layer 709 and the buried first-conductivity-type well 711 may be in a range from 200 nm to 2,000 nm, although lesser and greater depths may also be used. The average atomic concentration of dopants of the first conductivity type in the buried first-conductivity-type well 711 may be in a range from $1.0 \times 10^{17}/cm^3$ to $1.0 \times 10^{19}/cm^3$, such as from $3.0 \times 10^{17}/cm^3$ to $3.0 \times 10^{18}/cm^3$. The average atomic concentration of the dopants of the first conductivity type in the buried first-conductivity-type well 711 may be high enough to provide sufficient electrical conductivity to charge carriers during avalanche breakdown, and may be low enough to prevent premature breakdown at low voltages which occur during normal operation of the field effect transistors.

The top surface of the buried first-conductivity-type well 711 may be located above the horizontal plane including the bottom surfaces of the shallow trench isolation structures 720. In such an embodiment, each body semiconductor layer 709 may be laterally confined within sidewalls of a respective shallow trench isolation structure 720, and may be vertically confined between a top surface of the buried first-conductivity-type well 711 and the front surface (i.e., the top surface) of the semiconductor substrate 8. The remaining portion of the body semiconductor layer 709 as originally provided at the processing steps of FIG. 1A and now underlies the buried first-conductivity-type well 711 is not subsequently used as a body region of a field effect transistor, and as such, is hereafter referred to as a substrate semiconductor layer 719. The substrate semiconductor layer 719 may have the same atomic concentration of dopants of the first conductivity type as the body semiconductor layer 709. In one embodiment, the buried first-conductivity-type well 711 may be formed as a single continuous layer that extends continuously underneath all device regions and underneath all shallow trench isolation structures 720. Alternatively, the bottom surface of the buried first-conductivity-type well 711 may be formed above the horizontal plane including the bottom surfaces of the shallow trench isolation structure 720, and multiple disjoined buried first-conductivity-type wells 711 may be formed. In such an embodiment, each buried first-conductivity-type well 711 may be laterally surrounded by, and may laterally contact, a respective shallow trench isolation structure 720.

The buried second-conductivity-type well 712 may be formed in a second blanket ion implantation process, which may be performed after, or prior to, the first blanket ion implantation process. The second blanket ion implantation process may implant dopants of the second conductivity type to an implantation depth that may be located below the depth of the bottom surface of the shallow trench isolation structures 720. Due to the stochastic nature of the depth of the implanted dopants of the second conductivity type, the buried second-conductivity-type well 712 may be formed with a finite thickness. This finite thickness may be in a range from 20 nm to 600 nm, such as from 40 nm to 300 nm. A p-n junction may be formed between the buried second-conductivity-type well 712 and each of the buried first-conductivity-type well 711 and the substrate semiconductor layer 719. The average atomic concentration of dopants of the second conductivity type in the buried second-conductivity-type well 712 may be in a range from $1.0 \times 10^{17}/cm^3$ to $1.0 \times 10^{19}/cm^3$, such as from $3.0 \times 10^{17}/cm^3$ to $3.0 \times 10^{18}/cm^3$. The average atomic concentration of the dopants of the second conductivity type in the buried second-conductivity-type well 712 may be high enough to provide sufficient electrical conductivity to charge carriers during avalanche breakdown to function as an auxiliary conductive path, and may be low enough to prevent the buried second-conductivity-type well 712 from function as a conductive path at low voltages which occur during normal operation of the field effect transistors.

While an embodiment in which the buried first-conductivity-type well 711 and the buried second-conductivity-type well 712 are serially formed is used to describe a process for forming the first exemplary structure, embodiments are expressly contemplated herein in which at least one of the ion implantation processes that form the buried first-conductivity-type well 711 and/or the buried second-conductivity-type well 712 may be performed in a parallel or contemporaneous processing step. Generally, the buried first-conductivity-type well 711 and/or the buried second-conductivity-type well 712 may be formed prior to, between, or after, processing steps used to form gate stack structures, source regions, drain regions, and doped body contact regions. In embodiments in which the buried first-conductivity-type well 711 is formed as a continuous layer over the entire area of the semiconductor substrate 8, the buried first-conductivity-type well 711 may have an areal overlap with each of the gate stack structures, source regions, drain regions, and doped body contact regions to be subsequently formed. As far as the species of electrical dopants are concerned, boron or indium may be used as p-type dopants, and phosphorus, arsenic, and/or antimony may be used as n-type dopants during the ion implantation processes.

Figure 1C:
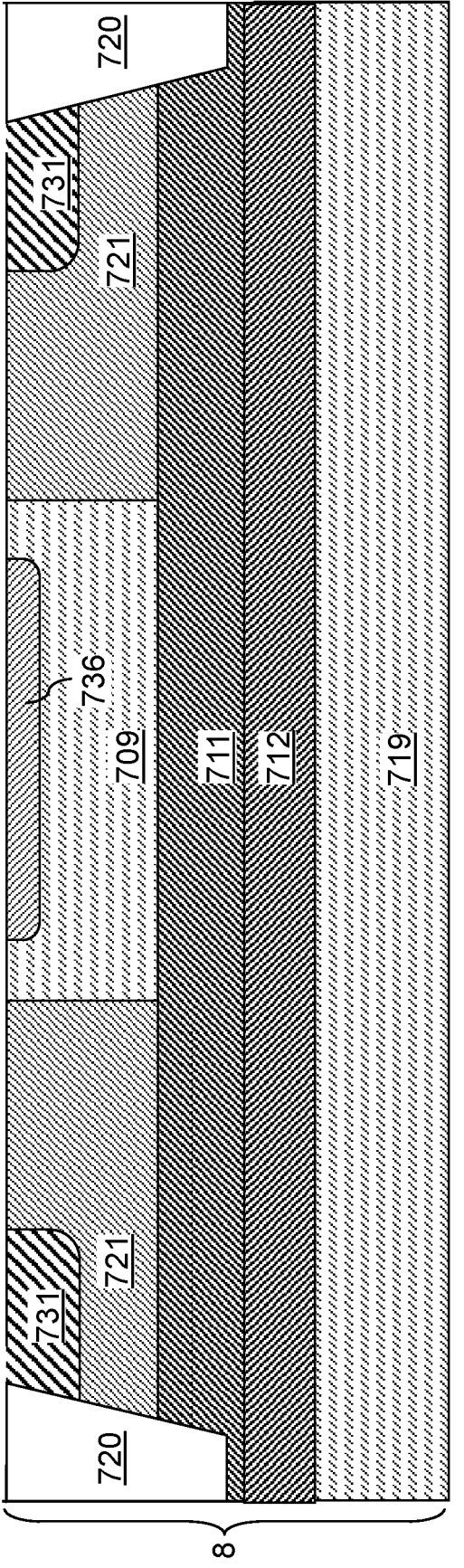
FIG. 1C is a vertical cross-sectional view of the first exemplary structure after formation of at least one source-side first-conductivity-type well, at least one doped body contact region, and a drain extension region according to an embodiment of the present disclosure.

Referring to FIG. 1C, dopants of the first conductivity type may be implanted into at least one surface region of the body semiconductor layer 709 using a first masked ion implantation process to form at least one doped body contact region 731. Each of the at least one doped body contact region 731 may be a heavily doped semiconductor region having a doping of the first conductivity type, and may be used to provide electrical contact to the body semiconductor layer 709. In one embodiment, the at least one doped body contact region 731 may be formed adjacent to the shallow trench isolation structure 720. The at least one doped body contact region 731 may be heavily doped to provide high electrical conductivity. For example, the at least one doped body contact region 731 may include dopants of the first conductivity type at an average atomic concentration in a range from $5.0 \times 10^{19}/cm^3$ to $2.0 \times 10^{21}/cm^3$. The depth of a planar bottom surface of each doped body contact region 731 may be in a range from 50 nm to 200 nm, although lesser and greater depths may also be used. The at least one doped body contact region 731 may be vertically spaced from the buried first-conductivity-type well 711.

Additional dopants of the first conductivity type may be implanted into the body semiconductor layer 709 using a second masked ion implantation process to form at least one source-side first-conductivity-type well 721. The ion implantation energy of the second masked ion implantation process may be selected such that each source-side first-conductivity-type well 721 vertically extends from the front surface of the semiconductor substrate 8 (i.e., the top surface of the body semiconductor layer 709) to the top surface of the buried first-conductivity-type well 711. In one embodiment, the at least one source-side first-conductivity-type well 721 may vertically connect the buried first-conductivity-type well 711 to a respective doped body contact region 731. In one embodiment, the at least one source-side first-conductivity-type well 721 may be formed adjacent to the shallow trench isolation structure 720. The at least one source-side first-conductivity-type well 721 may have a higher atomic concentration of dopants of the first conductivity type than the body semiconductor layer 709. The at least one source-side first-conductivity-type well 721 may be doped at a level that provides a sufficient level of resistivity to allow the at least one source-side first-conductivity-type well 721 to function as an electrically conductive path during avalanche breakdown, but is not sufficient to function as an electrically conductive path during normal operation of a field effect transistor. For example, the at least one source-side first-conductivity-type well 721 may include dopants of the first conductivity type at an average atomic concentration in a range from $1.0 \times 10^{18}/cm^3$ to $5.0 \times 10^{19}/cm^3$. In one embodiment, each doped body contact region 731 may contact, and may be laterally bounded by, a combination of a source-side first-conductivity-type well 721 and the shallow trench isolation structures 720.

Dopants of the second conductivity type may be implanted into a surface region of the body semiconductor layer 709 using a third masked ion implantation process to form a drain extension region 736. The drain extension region 736 may be a region having a doping of the second conductivity type and functions as an extension region of a drain region that underlies an end portion of a gate dielectric. The drain extension region 736 may determine the voltage-current characteristics of a field effect transistor by determining the location of a p-n junction on the drain side of the field effect transistor. Further, the atomic concentration of the dopants of the second conductivity type in the drain extension region 736 determines the profile of electrical field on the drain side during operation of the field effect transistor. In one embodiment, a field effect transistor may be designed to have an asymmetric extension profile between the source side and the drain side, and the drain extension region 736 may have a larger overlap area with a gate dielectric to be subsequently formed than an overlap area between a source extension region and the gate dielectric. The drain extension region 736 may have an atomic concentration of dopants of the second conductivity type that may be lower than the atomic concentration of dopants of the second conductivity in deep source regions and deep drain regions to be subsequently formed. For example, the drain extension region 736 may include dopants of the second conductivity type at an average atomic concentration in a range from $1.0 \times 10^{18}/cm^3$ to $1.0 \times 10^{20}/cm^3$. The depth of a bottom surface of the drain extension region 736 may be in a range from 20 nm to 100 nm, although lesser and greater depths may also be used. The drain extension regions 736 may be laterally spaced from the source-side first-conductivity-type well 721 by a surface portion of the body semiconductor layer 709, in which a semiconductor channel is subsequently formed.

Figure 1D:
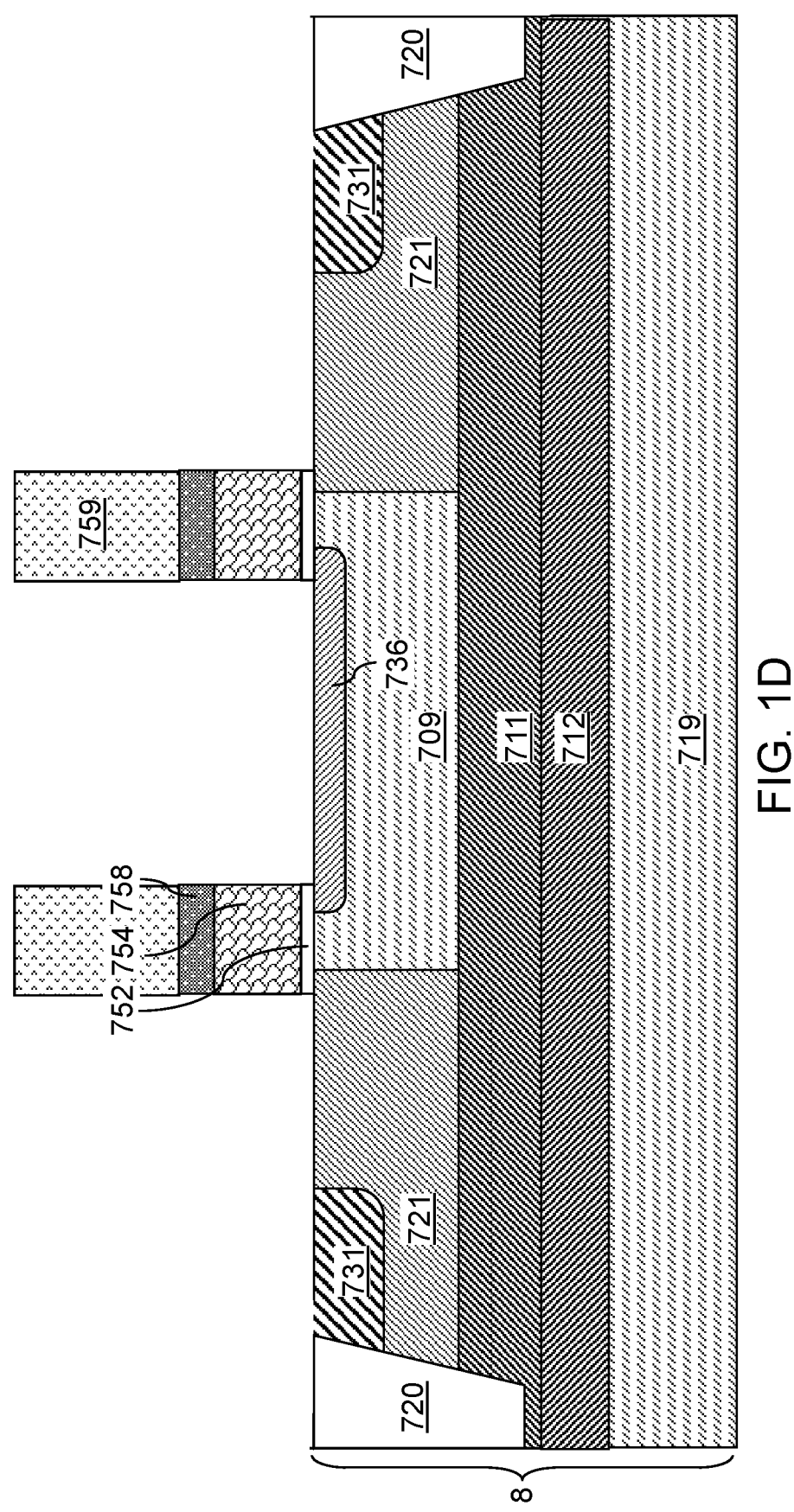
FIG. 1D is a vertical cross-sectional view of the first exemplary structure after formation of at least one gate stack structure according to an embodiment of the present disclosure.

Referring to FIG. 1D, a gate dielectric layer, a gate electrode layer, and a gate cap dielectric layer may be sequentially formed over the front surface of the semiconductor substrate 8 by depositing the gate dielectric layer, gate electrode layer, and gate cap dielectric layer. A photoresist layer 759 may be applied and lithographically patterned over the gate cap dielectric layer into gate patterns, which may extend across a respective portion of the body semiconductor layer 709. For example, each lithographically patterned portion of the photoresist layer 759 may overlie a portion of the body semiconductor layer 709 that extend to the front surface of the semiconductor substrate 8. Thus, the process of patterning the gate dielectric layer, gate electrode layer, and gate cap dielectric layer may be achieved.

An anisotropic etch process may be performed to transfer the pattern in the photoresist layer 759 through the gate cap dielectric layer, the gate electrode layer, and the gate dielectric layer. Stacks of a gate dielectric 752, a gate electrode 754, and a gate cap dielectric 758 may be formed. Each gate dielectric 752 comprises a patterned portion of the gate dielectric layer. Each gate electrode 754 comprises a patterned portion of the gate electrode layer. Each gate cap dielectric comprises a patterned portion of the gate gap dielectric layer. The photoresist layer 759 may be subsequently removed, for example, by ashing. Each gate electrode 754 may overlie a portion of a respective one of the drain extension regions 736, and may overlie a peripheral portion of a respective one of the source-side first-conductivity-type well 721.

Figure 1E:
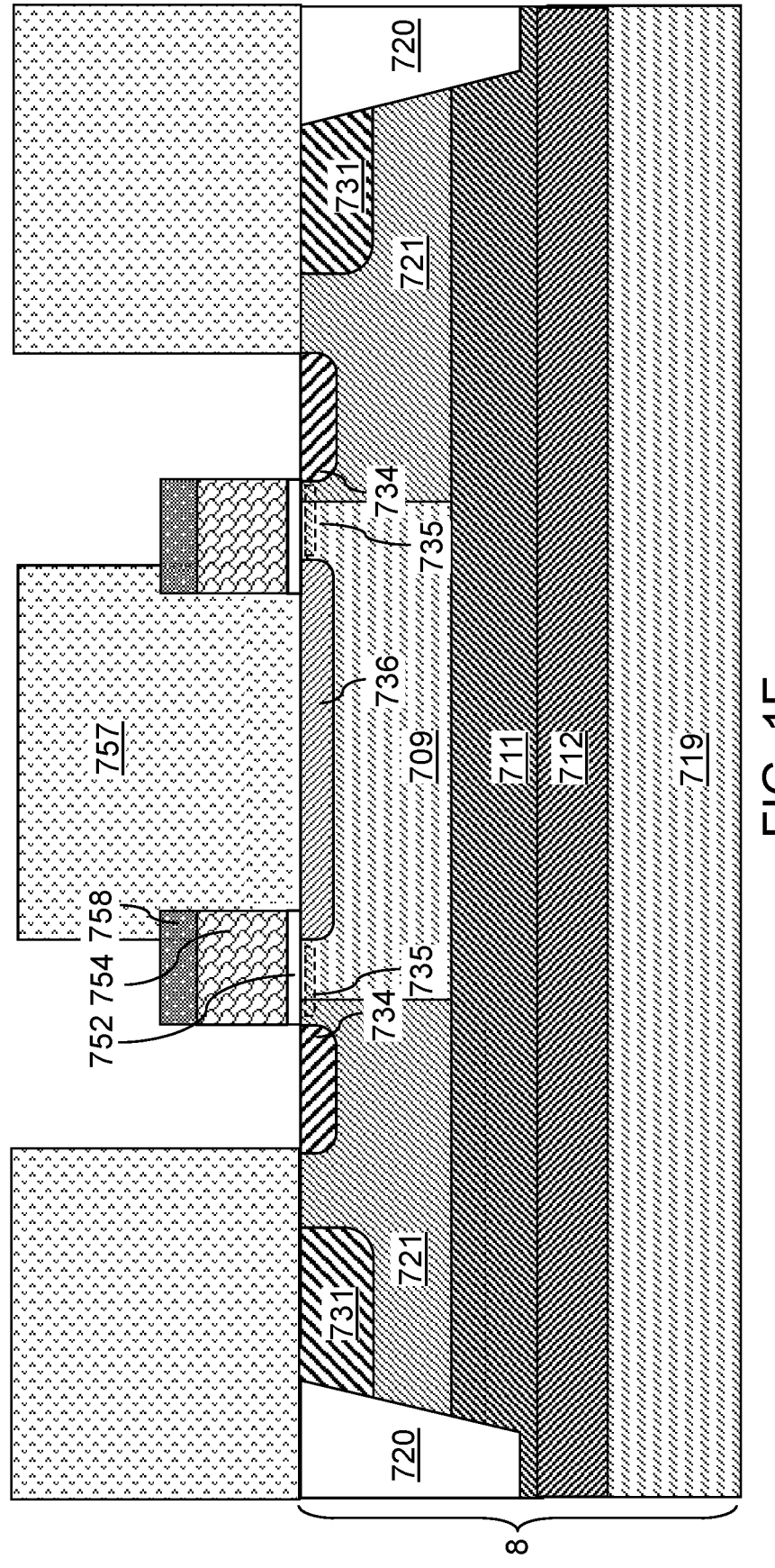
FIG. 1E is a vertical cross-sectional view of the first exemplary structure after formation of at least one source extension region according to an embodiment of the present disclosure.

Referring to FIG. 1E, at least one source extension region 734 may be formed by a masked ion implantation process and implanting dopants. A combination of a patterned photoresist layer 757, the gate electrodes 754, and the gate cap dielectrics 758 may be used as a composite implantation mask. Dopants of the second conductivity type may be implanted into portions of the source-side first-conductivity-type well(s) 721 that are not masked by the photoresist layer 757, the gate electrodes 754, or the gate cap dielectrics 758 to form at least one source extension region 734. Each source extension region 734 may include dopants of the second conductivity type at an average atomic concentration in a range from $5.0 \times 10^{18}/cm^3$ to $1.0 \times 10^{21}/cm^3$. The depth of a bottom surface of each source extension region 734 may be in a range from 20 nm to 100 nm, although lesser and greater depths may also be used. The source extension region(s) 734 may have the same dopant concentration as, or may have a higher dopant concentration than, the drain extension region 736. Each source extension regions 734 may be laterally spaced from the drain extension region 736 by a surface portion of the body semiconductor layer 709 and a surface portion of a source-side first-conductivity-type well 721, which constitutes a channel region 735. Each channel region 735 may be a semiconductor channel of a field effect transistor. The photoresist layer 757 may be subsequently removed, for example, by ashing.

Figure 1F:
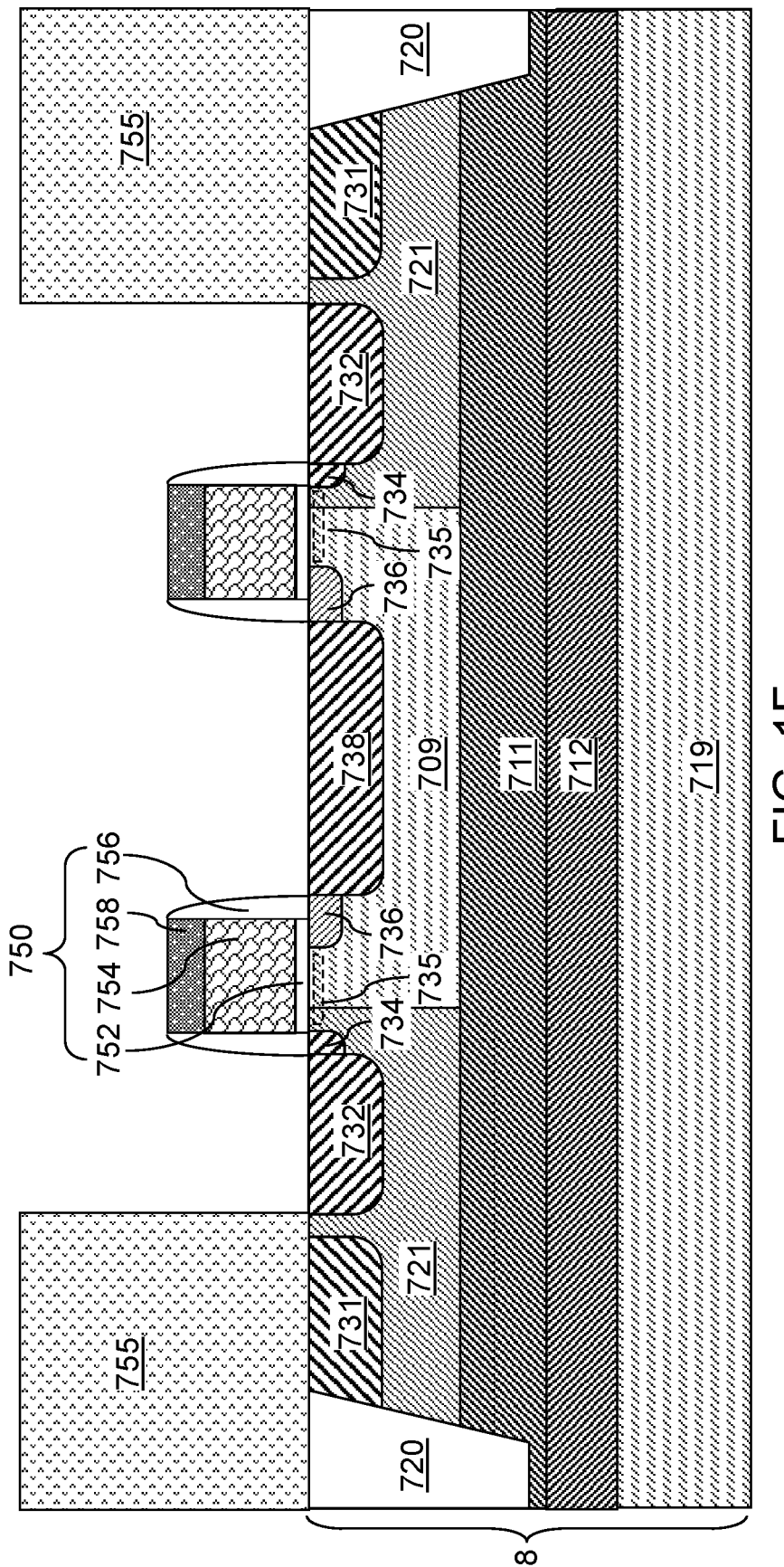
FIG. 1F is a vertical cross-sectional view of the first exemplary structure after formation of dielectric gate spacers, at least one deep source region, and a deep drain region according to an embodiment of the present disclosure.

Referring to FIG. 1F, dielectric gate spacers 756 may be formed on stacks of a gate dielectric 752, a gate electrode 754, and a gate cap dielectric 758. For example, a dielectric material layer may be conformally deposited and anisotropically etched to form the dielectric gate spacers 756. Each set of a gate dielectric 752, a gate electrode 754, a gate cap dielectric 758, and at least one dielectric gate spacer 756 forms a gate stack structure (752, 754, 758, 756).

A photoresist layer 755 may be applied over the semiconductor substrate 8 and the gate stack structures (752, 754, 758, 756), and may be patterned to form openings therethrough. The openings through the photoresist layer 755 may be formed around the gate stack structures (752, 754, 758, 756) so that outer edges of the dielectric gate spacers 756 are physically exposed within the openings through the photoresist layer 755. The photoresist layer 755 covers the doped body contact region(s) 731.

Dopants of the second conductivity type may be implanted into surface portions of the semiconductor substrate 8 that are not masked by the photoresist layer 755 or the gate stack structures 750 comprising elements (752, 754, 758, 756). The surface portions of the semiconductor substrate 8 that are implanted with the dopants of the second conductivity type comprise at least one deep source region 732 and a deep drain region 738. The at least one deep source region 732 and a deep drain region 738 may be heavily doped with dopants of the second conductivity type to provide high electrical conductivity. The atomic concentration of the dopants of the second conductivity type in the implanted regions may be higher than the atomic concentration of dopants of the second conductivity type in the source extension region(s) 734 and the drain extension region 736. For example, the at least one deep source region 732 and the deep drain region 738 may include dopants of the second conductivity type at an average atomic concentration in a range from $5.0 \times 10^{19}/cm^3$ to $2.0 \times 10^{21}/cm^3$, such as from $1.0 \times 10^{20}/cm^3$ to $1.0 \times 10^{21}/cm^3$. The photoresist layer 755 may be subsequently removed, for example, by ashing. The depth of the bottom surfaces of the at least one deep source region 732 and the deep drain region 738 may be in a range from 100 nm to 1,600 nm, such as from 200 nm to 800 nm, although lesser and greater depths may also be used.

Each combination of a deep source region 732 and a source extension region 734 constitutes a source region (732, 734). Each combination of a deep drain region 738 and a drain extension region 736 constitutes a drain region (736, 738). A source region (732, 734) and a drain region (736, 738) may be laterally spaced apart by a channel region 735 that underlies a respective gate stack structure (752, 754, 758, 756). In one embodiment, a source-side first-conductivity-type well 721 may laterally surround the source region (732, 734), and may form forms a p-n junction with the source region (732, 734). In one embodiment, a channel region 735 may underlie a gate dielectric 752, and may laterally extend through an upper portion of a source-side first-conductivity-type well 721 and through an upper portion of the body semiconductor layer 709.

In one embodiment, the source region (732, 734) and the drain region (736, 738) of a field effect transistor may have asymmetric extension regions such that a drain extension region 736 has a greater areal overlap with a gate electrode 754 in a plan view than a source extension region 734 has with the gate electrode 754 in the plan view. A plan view refers to a view along a direction that is perpendicular to the front surface of the semiconductor substrate 8.

Figure 1G:
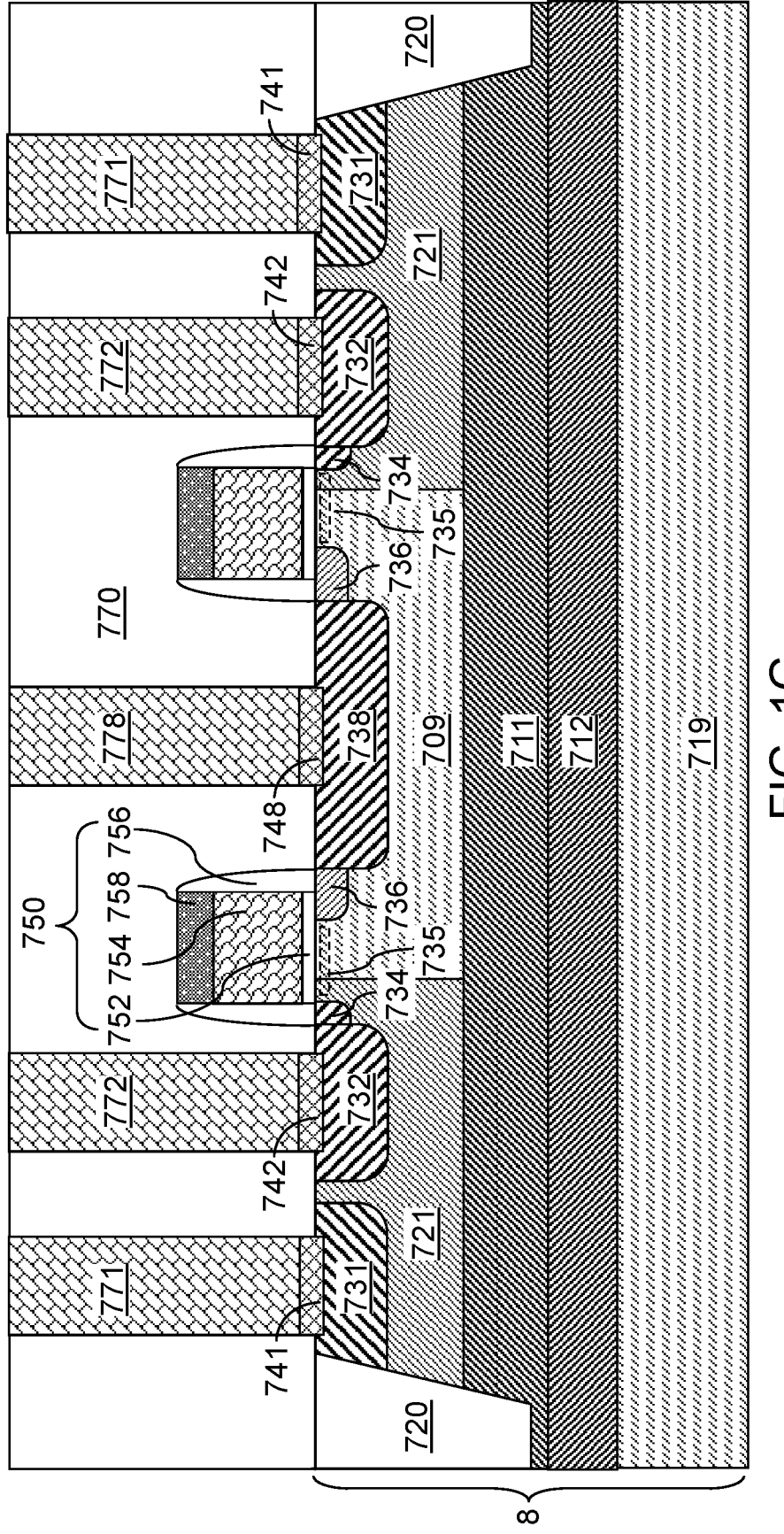
FIG. 1G is a vertical cross-sectional view of the first exemplary structure after formation of a contact-level dielectric layer, various metal-semiconductor alloy portions, and various contact via structures according to an embodiment of the present disclosure.
Figure 1H:
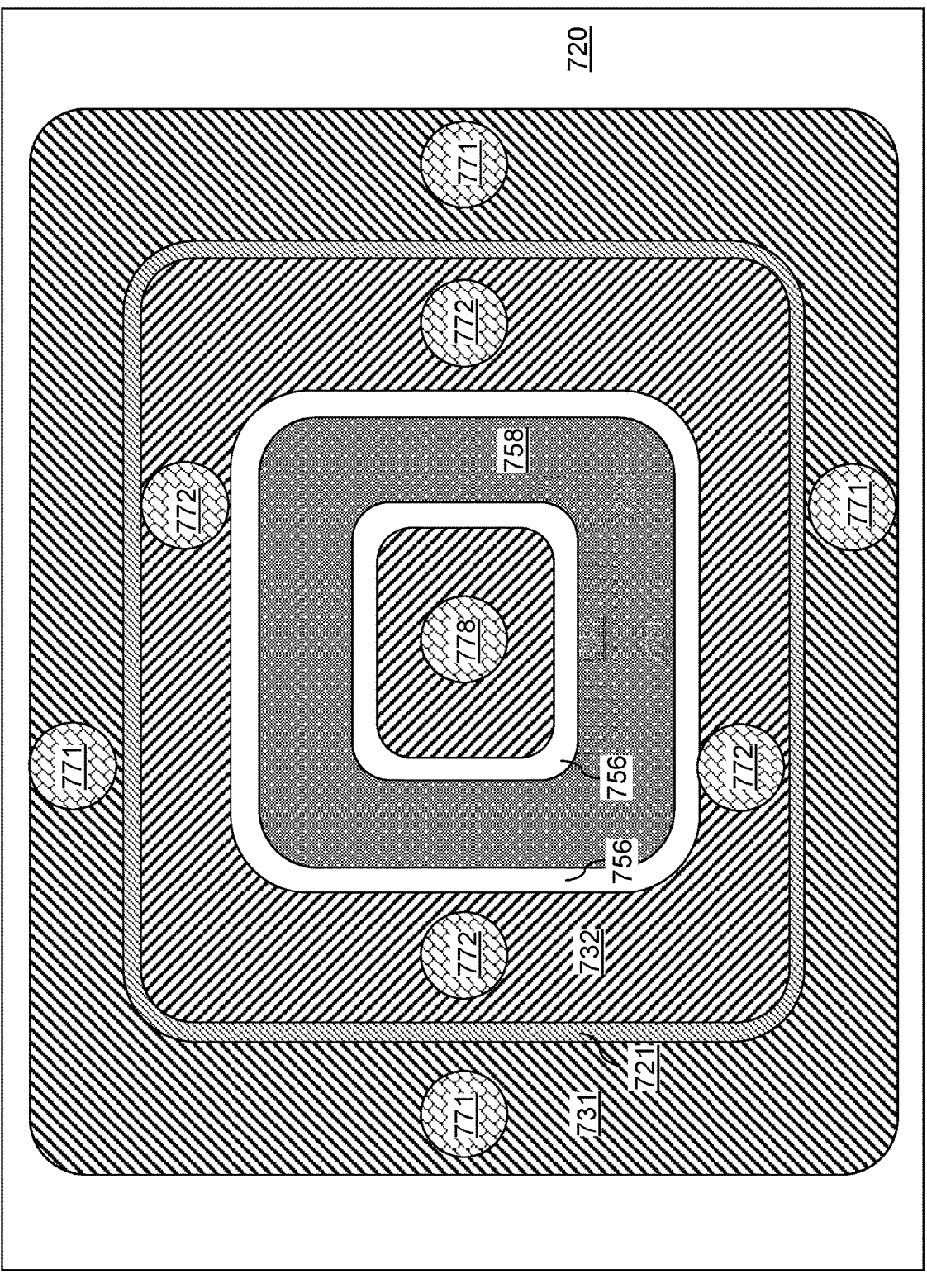
FIG. 1H is a see-through top-down of a first configuration of the first exemplary structure at the processing steps of FIG. 1G.
Figure 1I:
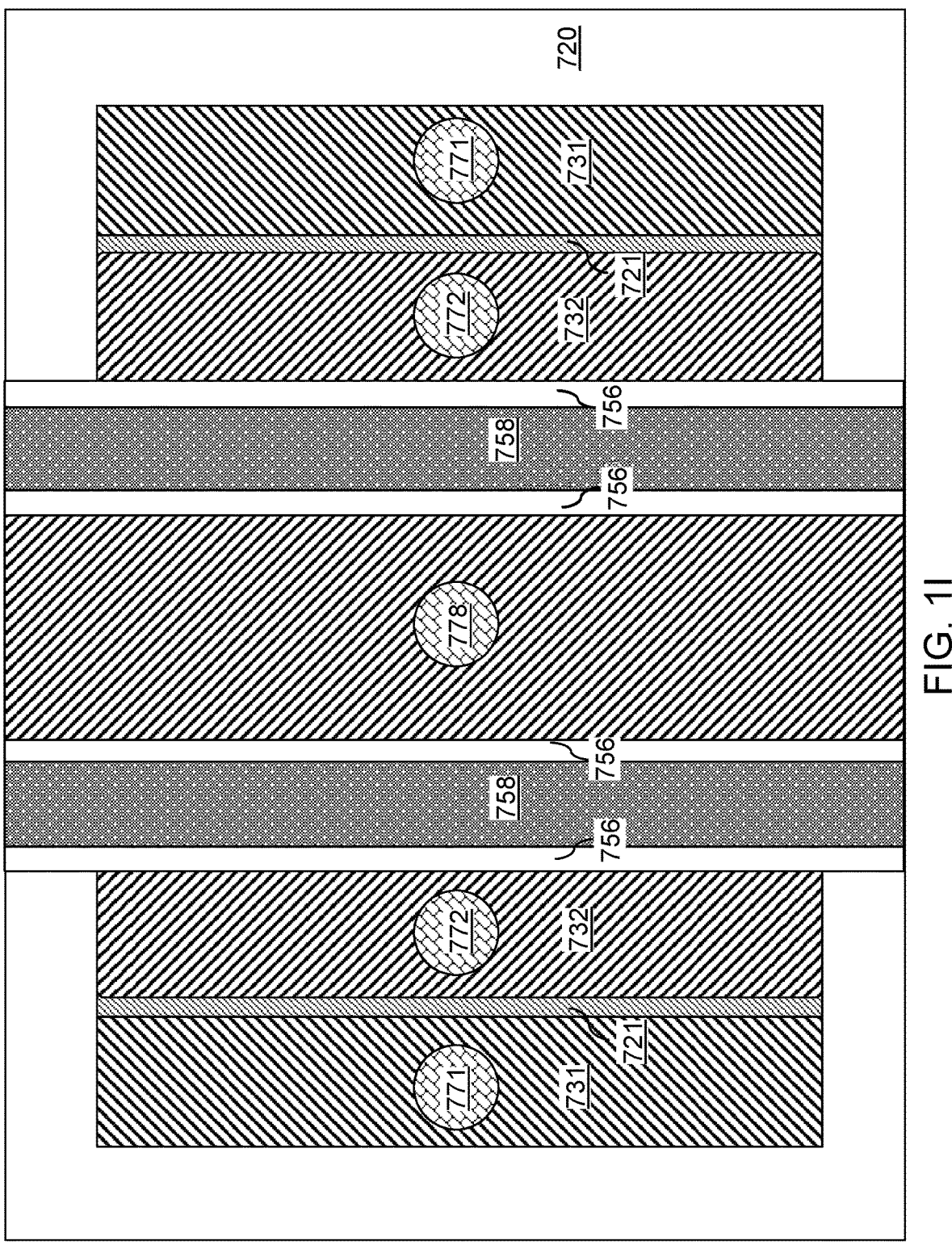
FIG. 1I is a see-through top-down of a second configuration of the first exemplary structure at the processing steps of FIG. 1G.

Referring to FIGS. 1G, 1H, and 1I, a contact-level dielectric layer 770 may be formed over the semiconductor substrate 8 and the gate stack structures (752, 754, 758, 756). FIG. 1G is a vertical cross-sectional view, FIG. 1H is a partial see-through top-down view of a first configuration of the first exemplary structure in which a contact-level dielectric layer 770 is not shown, and FIG. 1I is a partial see-through top-down view of a second configuration of the first exemplary structure in which a contact-level dielectric layer 770 is not shown. Both configurations illustrated in FIGS. 1H and 1I provide the same vertical cross-sectional view illustrated in FIG. 1G. Each top-down view is a plan view in which underlying structural elements masked by overlying structural elements are not shown except for omission of the contact-level dielectric layer 770.

The contact-level dielectric layer 770 may include a dielectric material such as silicon oxide or organosilicate glass, and may be formed by a conformal or non-conformal deposition process. The top surface of the contact-level dielectric layer 770 may be planarized, for example, by a chemical mechanical planarization process. Via cavities may be formed through the contact-level dielectric layer 770 over each of the doped body contact region 731, the source region(s) (732, 734), and the drain region (736, 738).

A metal layer may be deposited in the via cavities, and may be reacted with the underlying semiconductor material portions of the doped body contact region 731, the source region(s) (732, 734), and the drain region (736, 738) to form various metal-semiconductor alloy portions (741, 742, 748). The metal-semiconductor alloy portions (741, 742, 748) may include at least one body contact metal-semiconductor alloy portion 741, at least one source contact metal-semiconductor alloy portion 742, and a drain contact metal-semiconductor alloy portion 748. Unreacted portions of the metal layer may be removed, for example, by a wet etch process that removes the material of the metal layer selective to the metal-semiconductor alloy materials of the metal-semiconductor alloy portions (741, 742, 748). In one embodiment, the metal-semiconductor alloy portions (741, 742, 748) may include a metal silicide material such as nickel silicide, titanium silicide, tungsten silicide, etc. Other suitable materials are within the contemplated scope of disclosure.

At least one conductive material may be deposited in remaining volumes of the via cavities. For example, a metallic liner material such as TiN, TaN, or WN may be deposited, and a conductive fill material such as tungsten may be subsequently deposited in the remaining volumes of the via cavities. Excess portions of the at least one conductive material may be removed from above the horizontal plane including the top surface of the contact-level dielectric layer 770. Remaining portions of the at least one conductive material filling the via cavities comprise contact via structures (771, 772, 778). The contact via structures (771, 772, 778) may include at least one body contact via structure 771 contacting a respective body contact metal-semiconductor alloy portion 741, at least one source contact via structure 772 contacting a respective source contact metal-semiconductor alloy portion 742, and a drain contact via structure 778 contacting the drain contact metal-semiconductor alloy portion 748.

The drain region (736, 738) forms a p-n junction with the body semiconductor layer 709. The buried first-conductivity-type well 711 may have an areal overlap with the entirety of the drain region (736, 738) in the plan view, and may be vertically spaced apart from the drain region (736, 738) by a laterally-extending portion of the body semiconductor layer 709. The buried first-conductivity-type well 711 may have a higher atomic concentration of dopants of the first conductivity type than the body semiconductor layer 709.

The buried first-conductivity-type well 711 may be formed by performing an ion implantation process prior to formation of the gate stack structures (752, 754, 758, 756), and may have an areal overlap with an entirety of the source region(s) (732, 734), the drain region (736, 738), and the doped body contact region 731 in the plan view. If the ion implantation process is performed prior to formation of the gate stack structures (752, 754, 758, 756), the entirety of the top surface of the buried first-conductivity-type well 711 may be planar, and the entirety of the bottom surface of the buried first-conductivity-type well 711 may be planar (i.e., located within a horizontal plane).

In one embodiment, a shallow trench isolation structure 720 may laterally surround the source region(s) (732, 734), the drain region (736, 738), and the doped body contact region(s) 731. In one embodiment, the entirety of a closed periphery of an interface between a top surface of the buried first-conductivity-type well 711 and the body semiconductor layer 709 continuously contacts sidewalls of the shallow trench isolation structure 720.

Generally, the field effect transistor may have a configuration that causes more than 90% (which may be more than 95% and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the drain region (736, 738). The drain region (736, 738) may include a drain extension region 736 and a deep drain region 738 having a greater depth than the drain extension region 736. In one embodiment, the field effect transistor may have a configuration that causes more than 90% (which may be more than 95%, and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the deep drain region 738. The bottom surface of the deep drain region 738 may be located at a greater depth than the bottom surface of the drain extension region 736. Less than 10% (which may be less than 5%, and/or less than 2%, and/or less than 1%) of the electrical charges may impinge on a sidewall surface of the p-n junction between the drain region (736, 738) located above the bottommost surface of the drain region (736, 738), which is the bottom surface of the deep drain region 738.

Figure 2A:
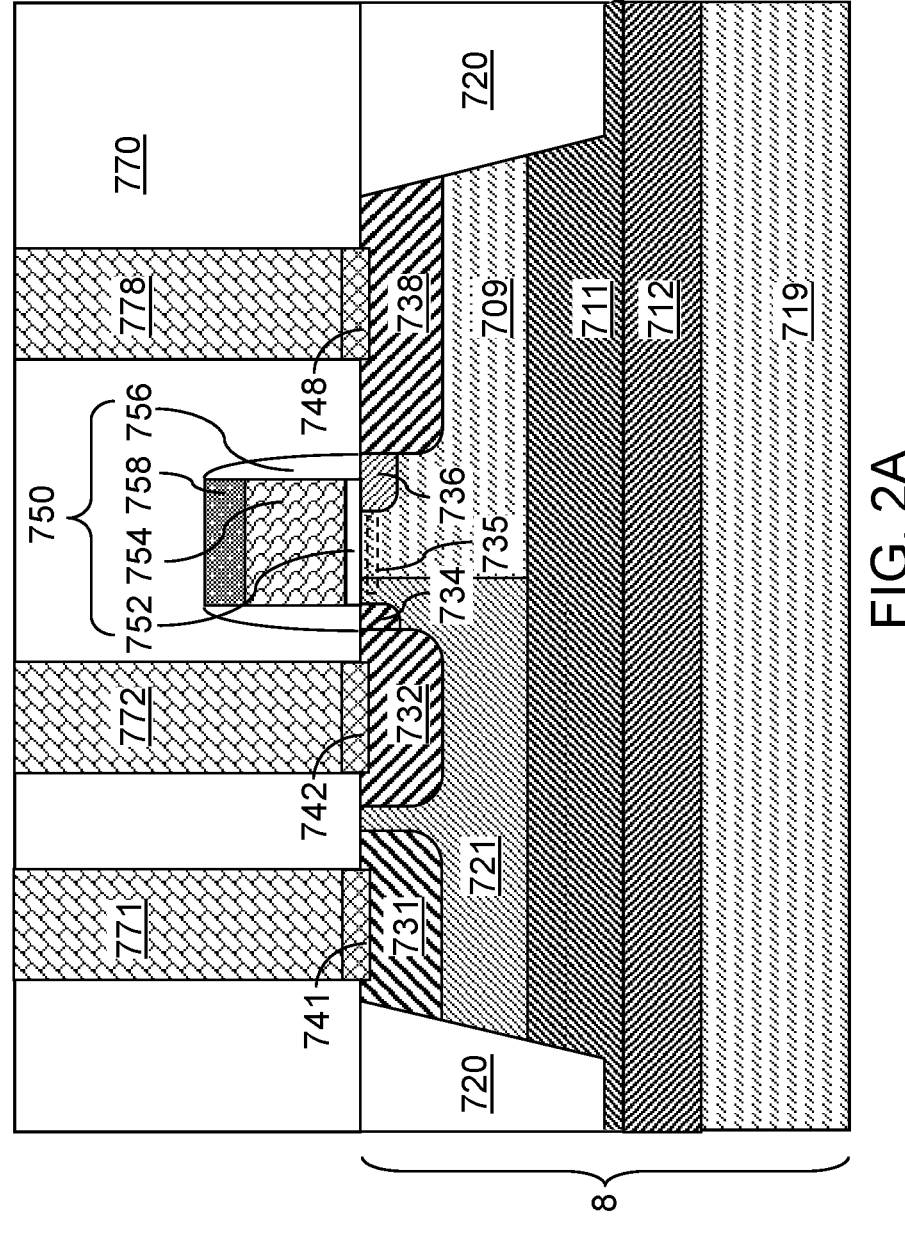
FIG. 2A is a vertical cross-sectional view of a second exemplary structure according to an embodiment of the present disclosure.
Figure 2B:
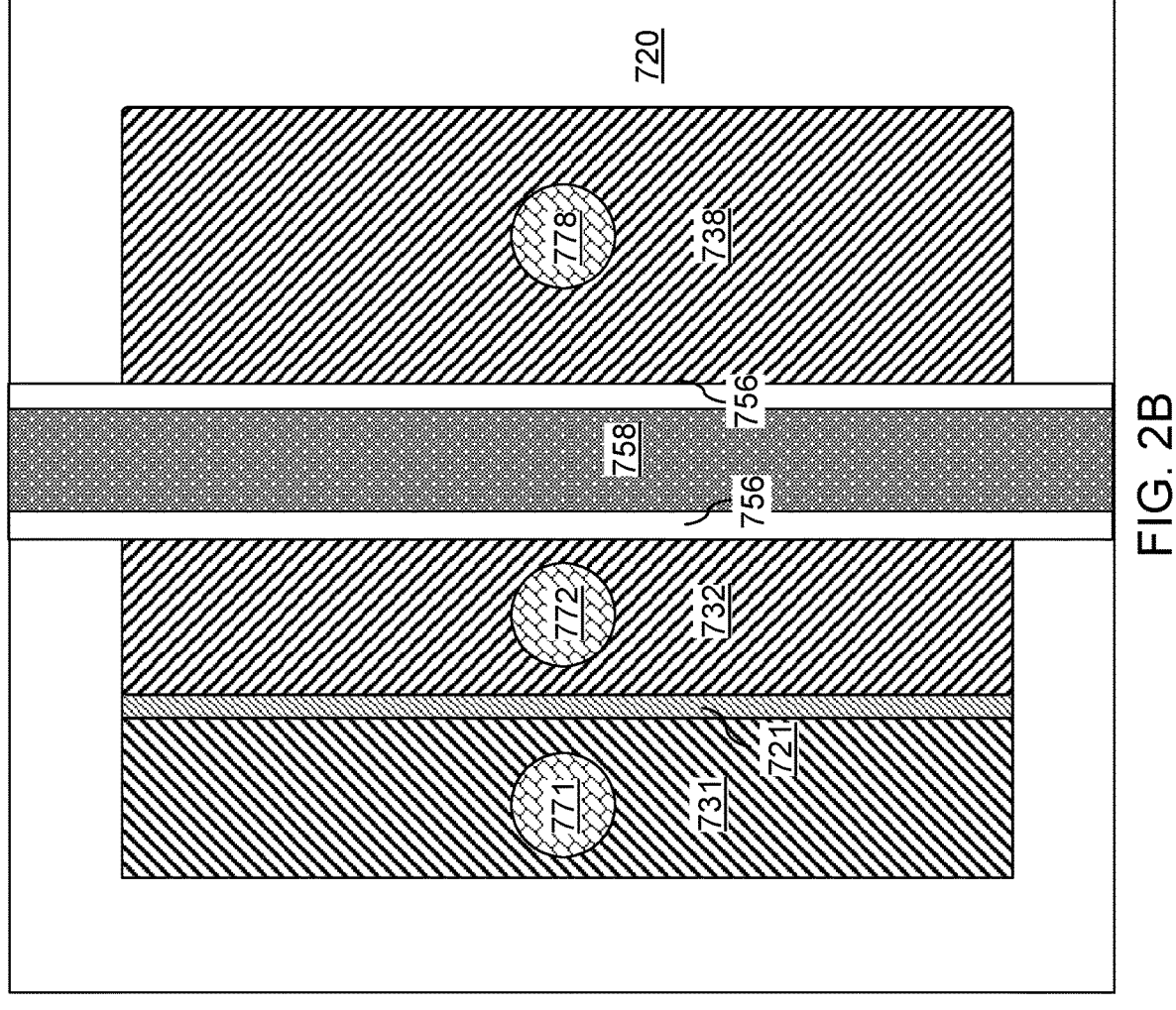
FIG. 2B is a see-through top-down view of the second exemplary structure of FIG. 2A.

Referring to FIGS. 2A and 2B, a second exemplary structure according to an embodiment of the present disclosure may be derived from the first exemplary structure by changing the layout of the source region (732, 734), the drain region (736, 738), and the doped body contact region 731. Specifically, the doped body contact region 731, the source region (732, 734), and the drain region (736, 738) may be arranged along a horizontal direction with a uniform width throughout, which is the lateral separation distance of two parallel portions of the shallow trench isolation structure 720. The second exemplary structure is an alternative configuration of the first exemplary structure.

Figure 3:
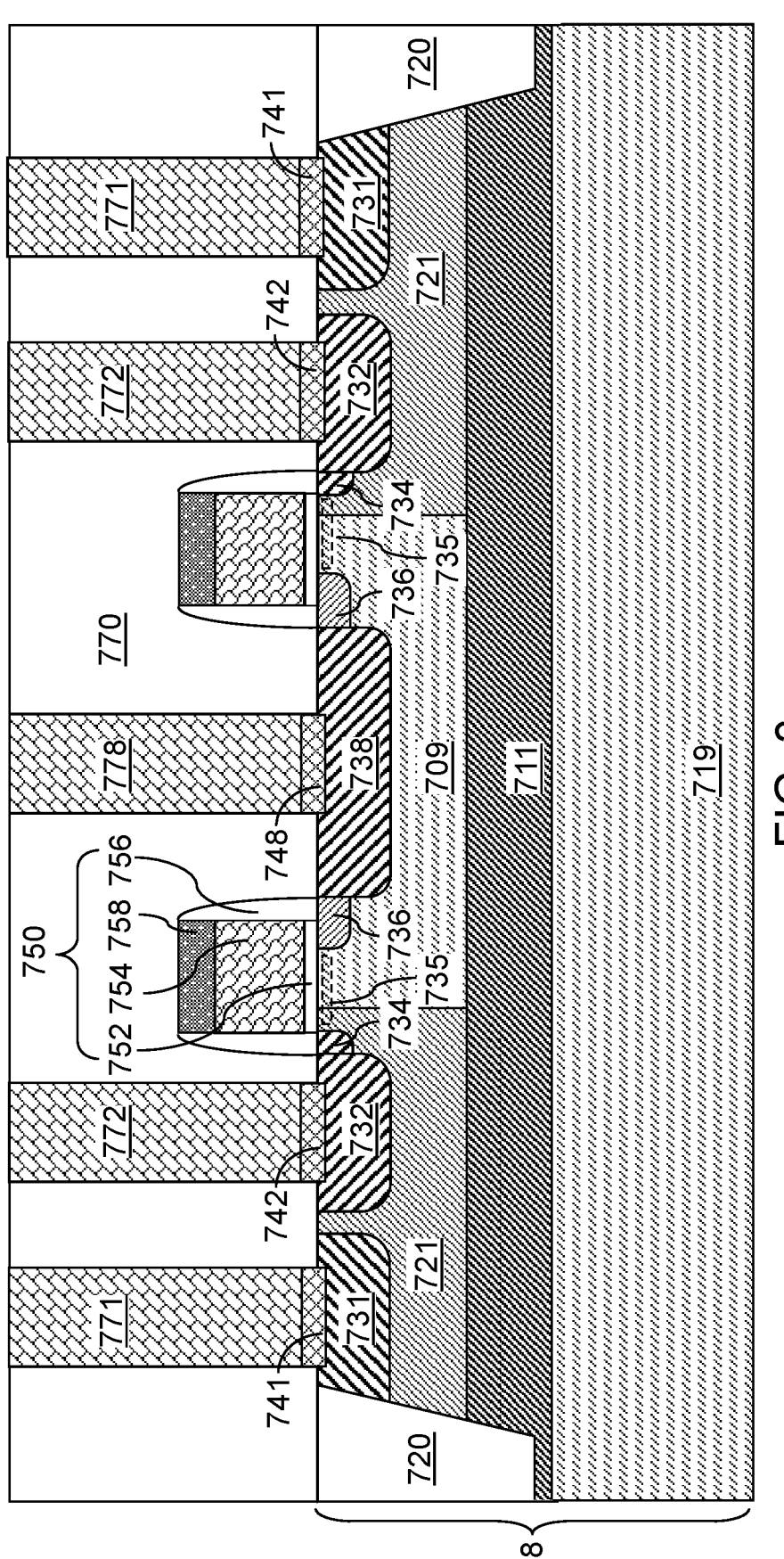
FIG. 3 is a vertical cross-sectional view of a third exemplary structure according to an embodiment of the present disclosure.

Referring to FIG. 3, a third exemplary structure according to an embodiment of the present disclosure may be derived from the first exemplary structure by omitting formation of the buried second-conductivity-type well 712. In this case, a horizontal bottom surface of the buried first-conductivity-type well 711 may contact a top surface of the substrate semiconductor layer 719. The third exemplary structure is an alternative configuration of the first exemplary structure and/or the second exemplary structure.

Figure 4:
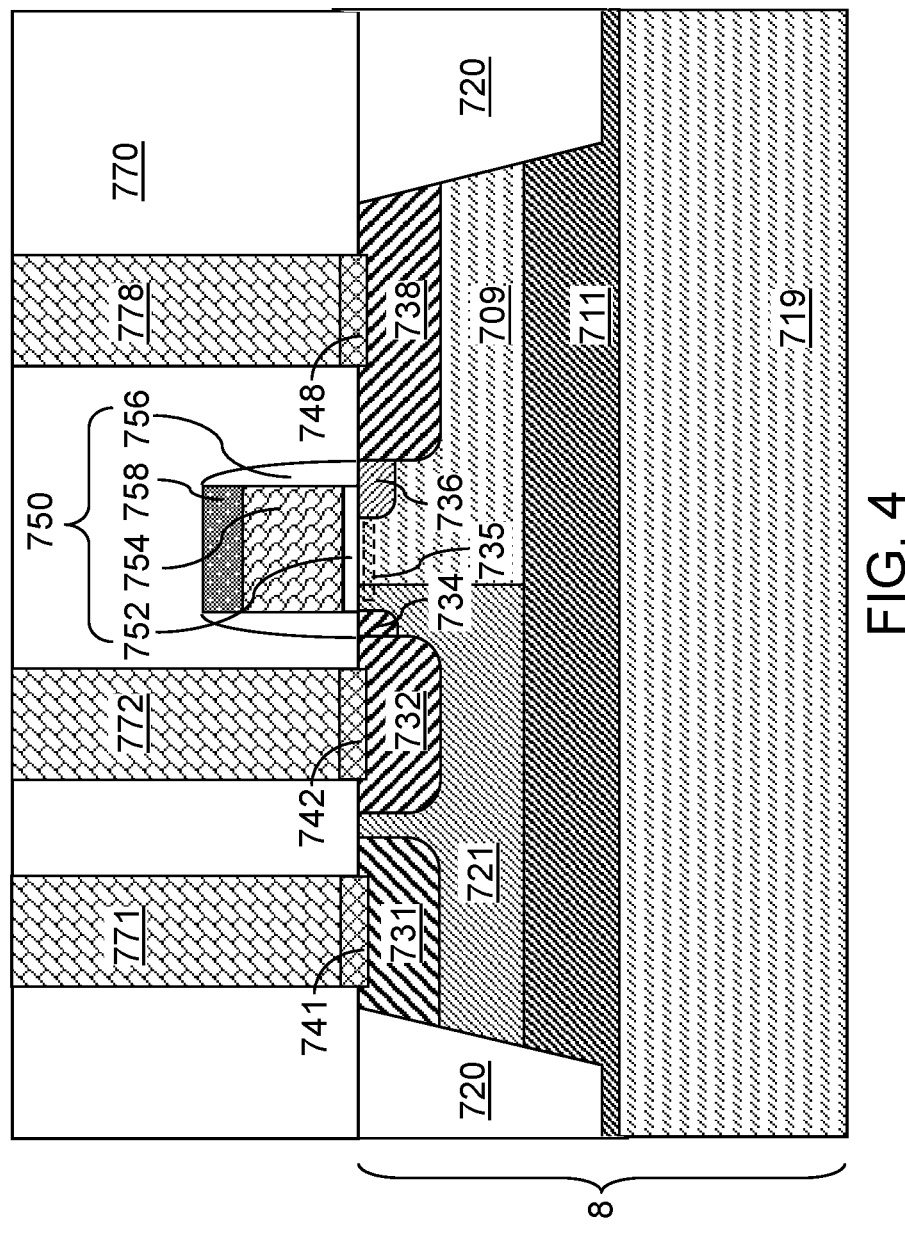
FIG. 4 is a vertical cross-sectional view of a fourth exemplary structure according to an embodiment of the present disclosure.

Referring to FIG. 4, a fourth exemplary structure according to an embodiment of the present disclosure may be derived from the second exemplary structure by omitting formation of the buried second-conductivity-type well 712. In this case, a horizontal bottom surface of the buried first-conductivity-type well 711 may contact a top surface of the substrate semiconductor layer 719. Alternatively, the fourth exemplary structure may be derived from the third exemplary structure by changing the layout of the source region (732, 734), the drain region (736, 738), and the doped body contact region 731.

Generally, the buried first-conductivity-type well 711 may be formed within the semiconductor substrate 8 by implanting dopants of the first conductivity type prior to, between, or after, processing steps used for formation of the gate stack structures (752, 754, 758, 756), the source region(s) (732, 734), the drain region (736, 738), and the doped body contact regions 731. Further, the lateral extent of each of the buried first-conductivity-type well 711 and the buried second-conductivity-type well 712 may be limited by using a patterned photoresist layer as an implantation mask during ion implantation processes used to form the buried first-conductivity-type well 711 and the buried second-conductivity-type well 712. The fourth exemplary structure is an alternative configuration of any of the first through third exemplary structures.

Figure 5A:
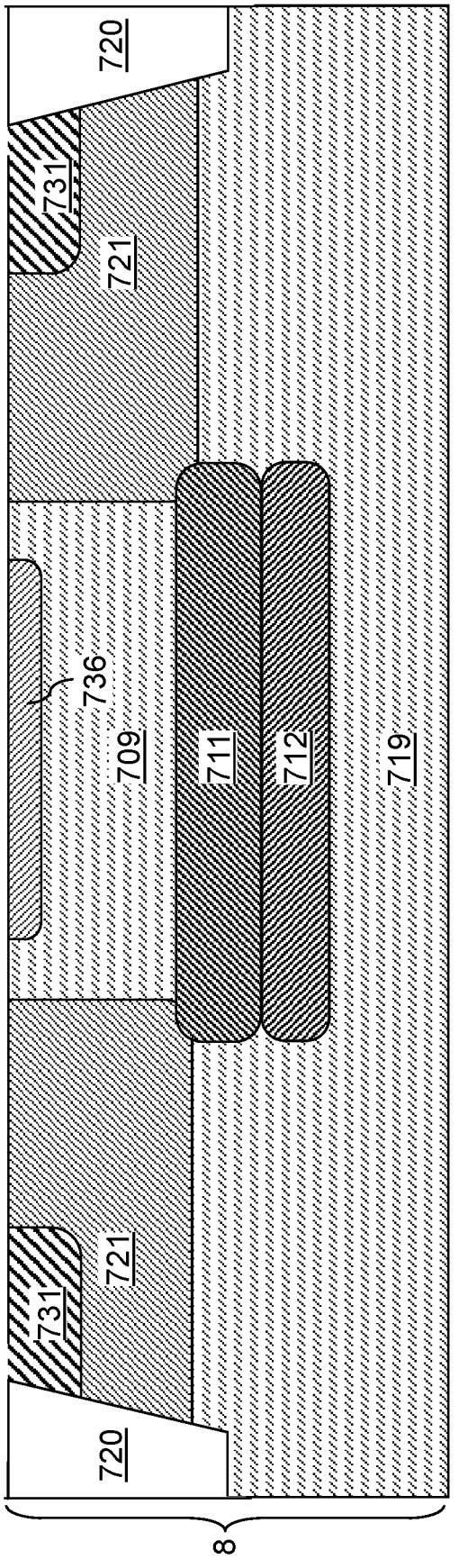
FIG. 5A is a vertical cross-sectional view of a fifth exemplary structure after formation of a shallow trench isolation structure, a buried first-conductivity-type well and a buried second-conductivity-type well, at least one source-side first-conductivity-type well, at least one doped body contact region, and a drain extension region according to an embodiment of the present disclosure.

Referring to FIG. 5A, a fifth exemplary structure according to an embodiment of the present disclosure is illustrated. The fifth exemplary structure may be derived from the first exemplary structure of FIG. 1C by limiting the lateral extent of each of the buried first-conductivity-type well 711 and the buried second-conductivity-type well 712. A patterned ion implantation mask layer (such as a patterned photoresist layer) may be used during ion implantation processes that form the buried first-conductivity-type well 711 and the buried second-conductivity-type well 712. In one embodiment, the lateral extent of the buried first conductivity-type well 711 may be selected such that the buried first-conductivity-type well 711 has an areal overlap with the drain region (736, 738) in a plan view, and does not have an areal overlap with the doped body contact region(s) 731. In one embodiment, the buried first conductivity-type well 711 may have an areal overlap with the entirety of the drain region (736, 738) in the plan view. In one embodiment, a same ion implantation mask may be used to perform ion implantation processes that form the buried first-conductivity-type well 711 and the buried second-conductivity-type well 712. The ion implantation processes that form the buried first-conductivity-type well 711 and the buried second-conductivity-type well 712 may be performed at any processing step prior to formation of the gate electrodes 754. In such an embodiment, each of the buried first-conductivity-type well 711 and the buried second-conductivity-type well 712 may have a respective horizontal top surface and a respective horizontal bottom surface.

In one embodiment, the lateral extent of the buried first-conductivity-type well 711 may be selected such that the source-side first-conductivity-type well 721 connects the doped body contact region 731 and the buried first-conductivity-type well 711. The buried second-conductivity-type well 712 may underlie the buried first-conductivity-type well 711, and may form a p-n junction with the buried first-conductivity-type well 711.

Figure 5B:
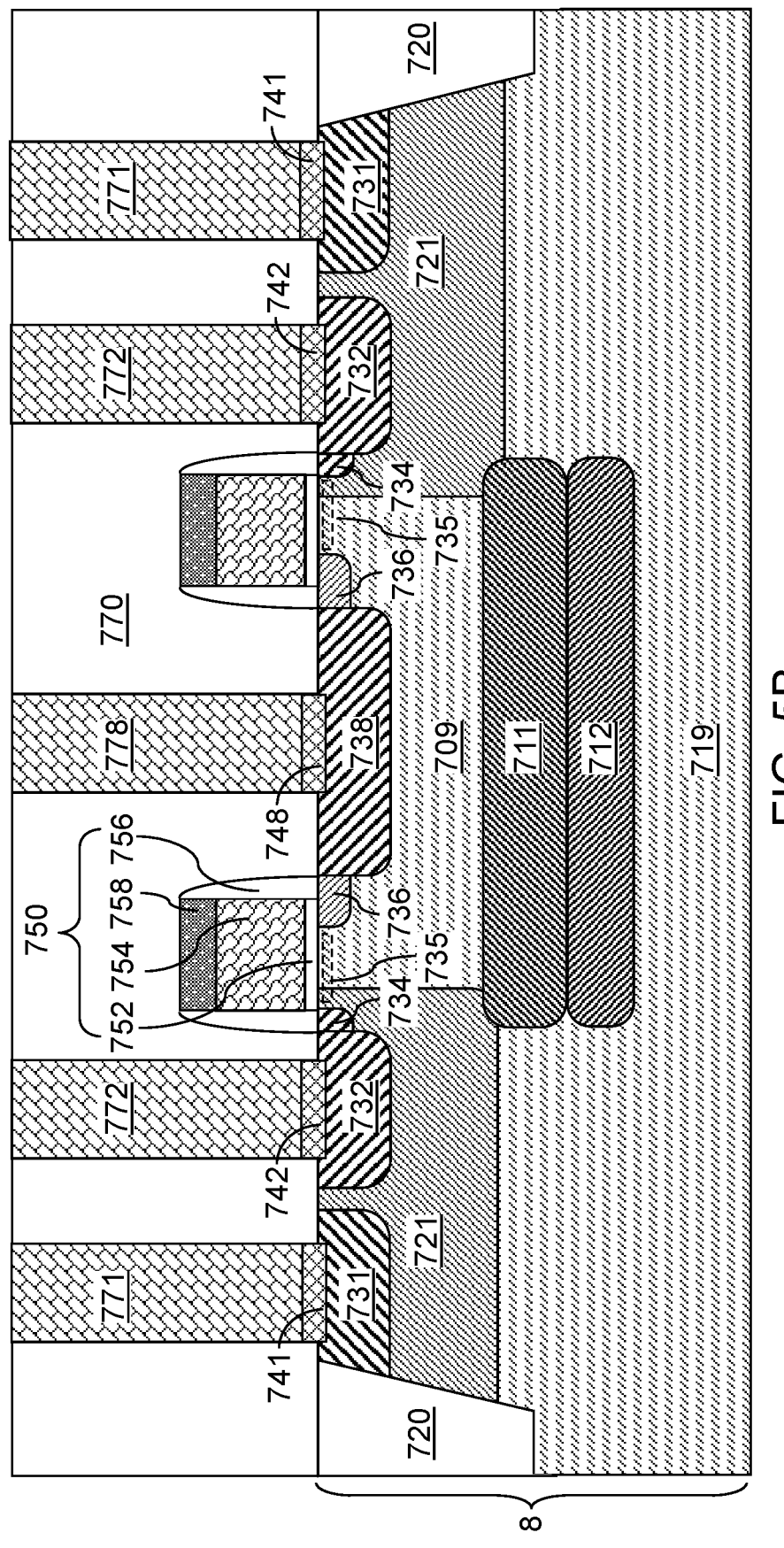
FIG. 5B is a vertical cross-sectional view of the fifth exemplary structure after formation of a contact-level dielectric layer, various metal-semiconductor alloy portions, and various contact via structures according to an embodiment of the present disclosure.

Referring to FIG. 5B, the processing steps of FIGS. 1D-1I may be performed to form gate stack structures (752, 754, 758, 756), at least one source region (732, 734), a drain region (736, 738), a contact-level dielectric layer 770, metal-semiconductor alloy portions (741, 742, 748), and contact via structures (771, 772, 778). The drain region (736, 738) forms a p-n junction with the body semiconductor layer 709. The source-side first-conductivity-type well 721 laterally surrounds the source region (732, 734) and forms a p-n junction with the source region (732, 734). A channel region 735 underlies a gate dielectric 752, and laterally extends through an upper portion of the source-side first-conductivity-type well 721 and through an upper portion of the body semiconductor layer 709. The buried first-conductivity-type well 711 may have an areal overlap with the entirety of an area of the drain region (736, 738) in a plan view, and does not overlap with any area of the doped body contact region 731 in the plan view.

The field effect transistor may have a configuration that causes more than 90% (which may be more than 95% and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the drain region (736, 738). The drain region (736, 738) may include a drain extension region 736 and a deep drain region 738 having a greater depth than the drain extension region 736. In one embodiment, the field effect transistor may have a configuration that causes more than 90% (which may be more than 95%, and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the deep drain region 738. The bottom surface of the deep drain region 738 may be located at a greater depth than the bottom surface of the drain extension region 736. Less than 10% (which may be less than 5%, and/or less than 2%, and/or less than 1%) of electrical charges may impinge on a sidewall surface of the p-n junction between the drain region (736, 738) located above the bottommost surface of the drain region (736, 738), which is the bottom surface of the deep drain region 738. The fifth exemplary structure is an alternative configuration of any of the first through fourth exemplary structures.

Figure 6:
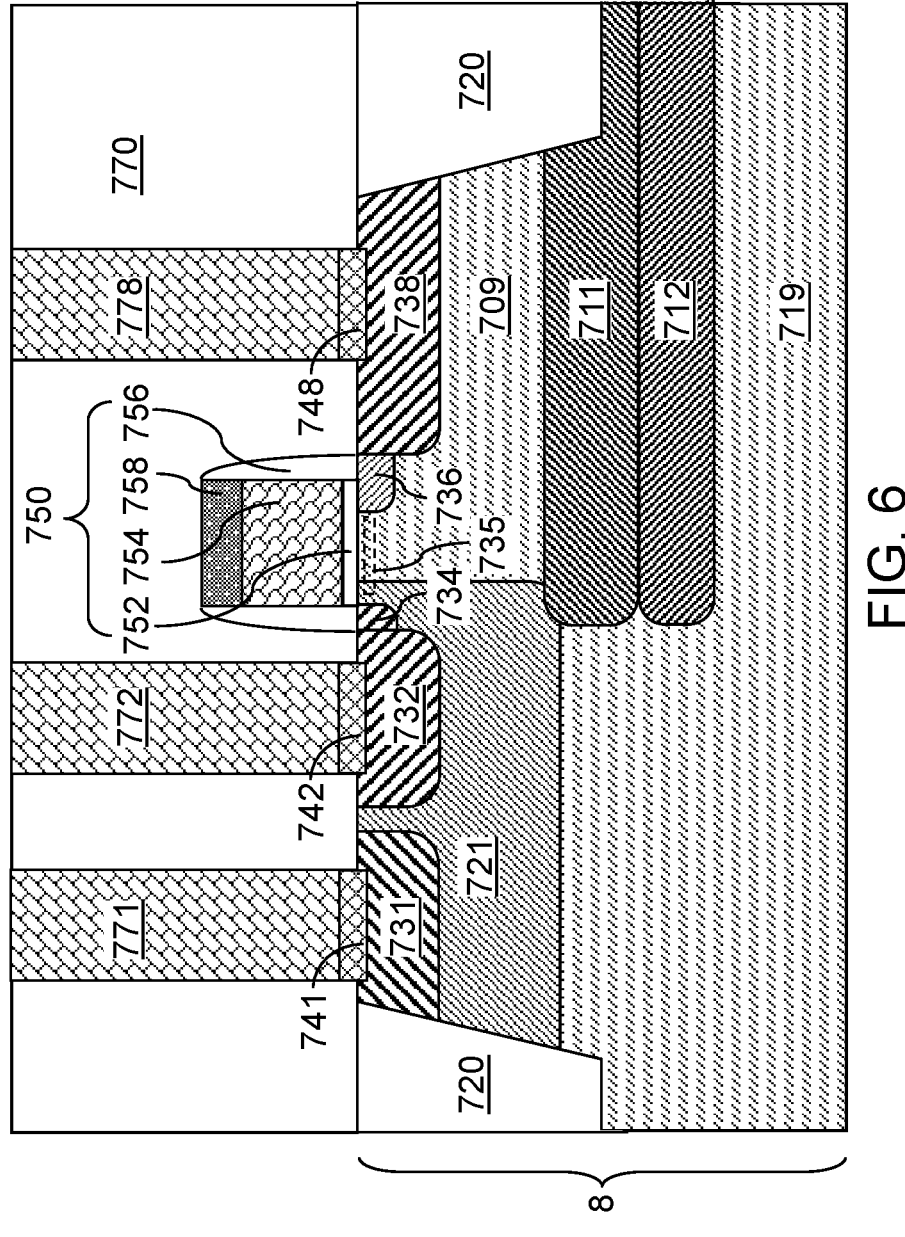
FIG. 6 is a vertical cross-sectional view of a sixth exemplary structure according to an embodiment of the present disclosure.

Referring to FIG. 6, a sixth exemplary structure according to an embodiment of the present disclosure may be derived from the fifth exemplary structure by changing the layout of the source region (732, 734), the drain region (736, 738), and the doped body contact region 731. Specifically, the doped body contact region 731, the source region (732, 734), and the drain region (736, 738) may be arranged along a horizontal direction with a uniform width throughout, which is the lateral separation distance of two parallel portions of the shallow trench isolation structure 720. The sixth exemplary structure is an alternative configuration of any of the first through fifth exemplary structures.

Figure 7:
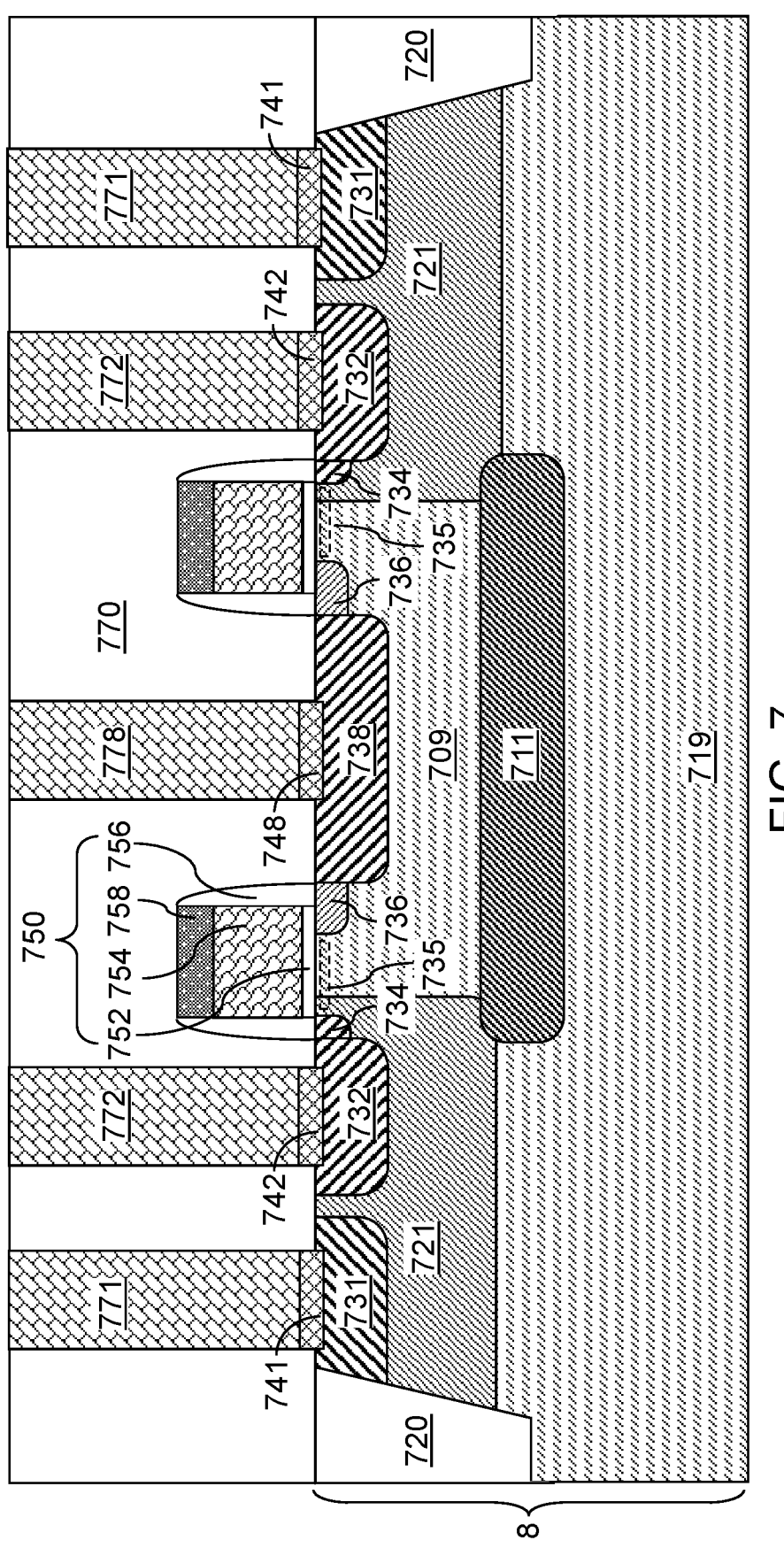
FIG. 7 is a vertical cross-sectional view of a seventh exemplary structure according to an embodiment of the present disclosure.

Referring to FIG. 7, a seventh exemplary structure according to an embodiment of the present disclosure may be derived from the fifth exemplary structure by omitting formation of the buried second-conductivity-type well 712. In this case, a horizontal bottom surface of the buried first-conductivity-type well 711 may contact a horizontal surface of the body semiconductor layer 709. The seventh exemplary structure is an alternative configuration of any of the first through sixth exemplary structures.

Figure 8:
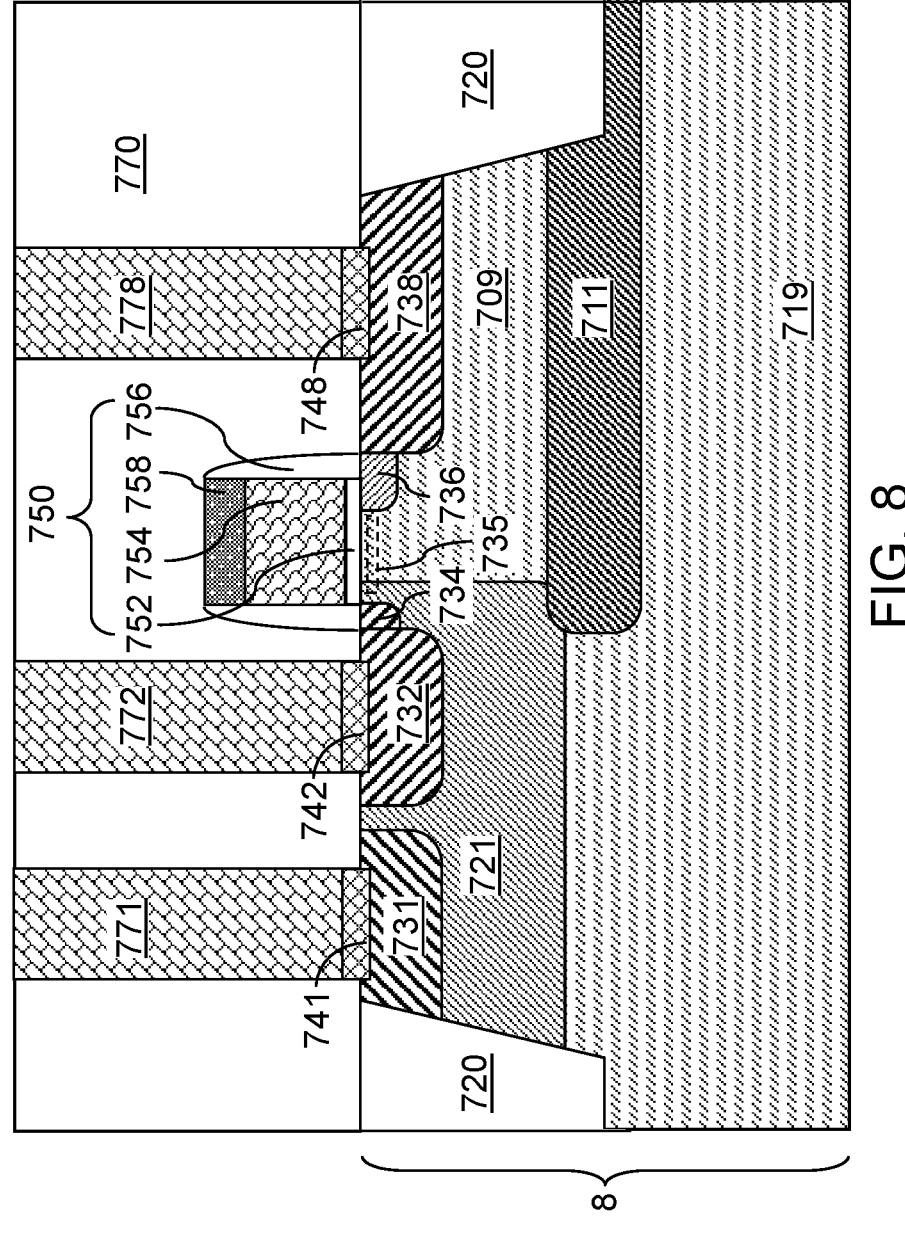
FIG. 8 is a vertical cross-sectional view of an eighth exemplary structure according to an embodiment of the present disclosure.

Referring to FIG. 8, an eighth exemplary structure according to an embodiment of the present disclosure may be derived from the sixth exemplary structure by omitting formation of the buried second-conductivity-type well 712. In this case, a horizontal bottom surface of the buried first-conductivity-type well 711 may contact a top surface of the substrate semiconductor layer 719. Alternatively, the eighth exemplary structure may be derived from the seventh exemplary structure by changing the layout of the source region (732, 734), the drain region (736, 738), and the doped body contact region 731. The eighth exemplary structure is an alternative configuration of any of the first through seventh exemplary structures.

Figure 9A:
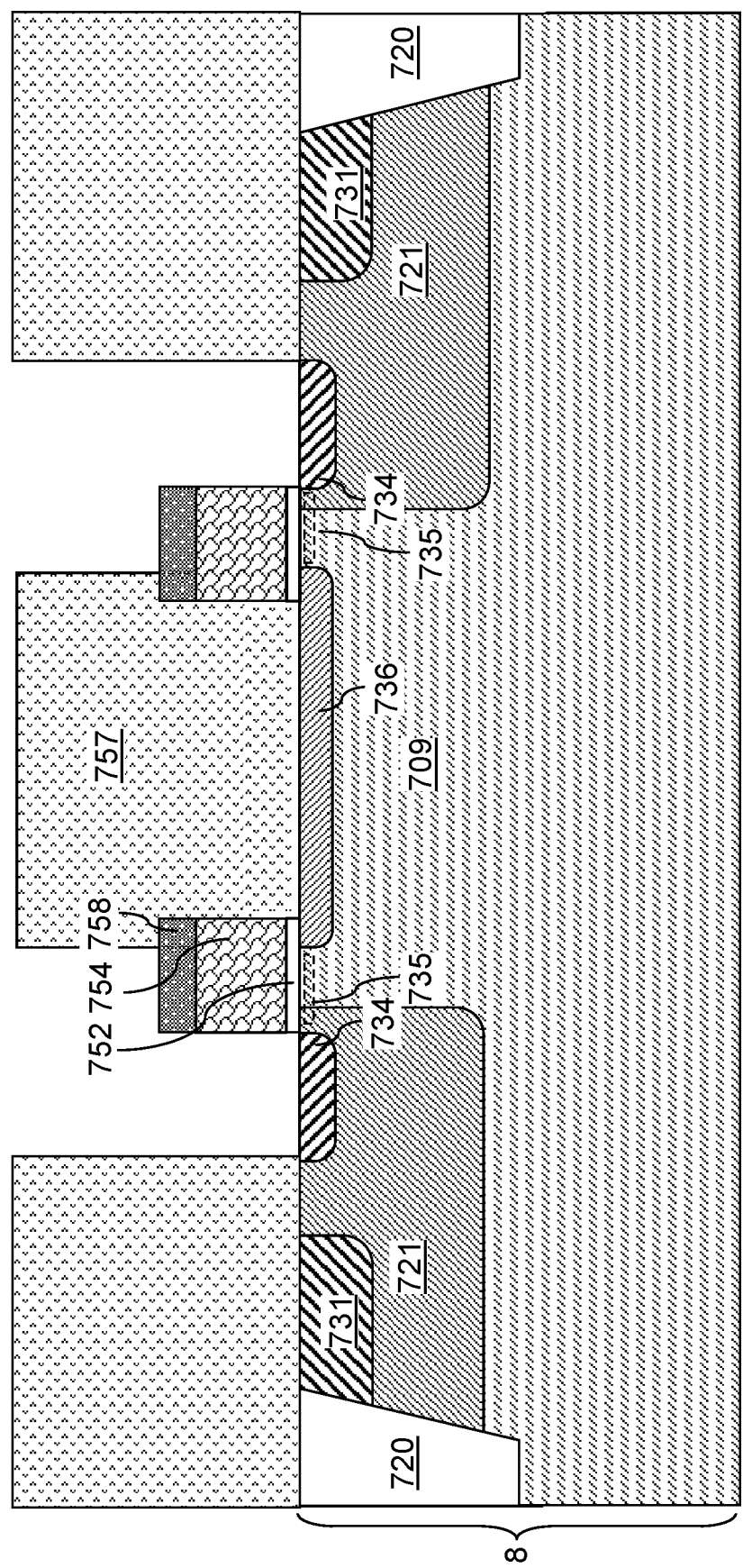
FIG. 9A is a vertical cross-sectional view of a ninth exemplary structure after formation of shallow trench isolation structures, a buried first-conductivity-type well, a buried second-conductivity-type well, at least one source-side first-conductivity-type well, at least one doped body contact region, a drain extension region, at least one gate electrode, and at least one source extension region according to an embodiment of the present disclosure.

Referring to FIG. 9A, a ninth exemplary structure according to an embodiment of the present disclosure may be derived from the first exemplary structure of FIG. 1E by omitting the processing steps of FIG. 1B. In other words, the buried first-conductivity-type well 711 and the buried second-conductivity-type well 712 are not formed at the processing steps of FIG. 1B.

Figure 9B:
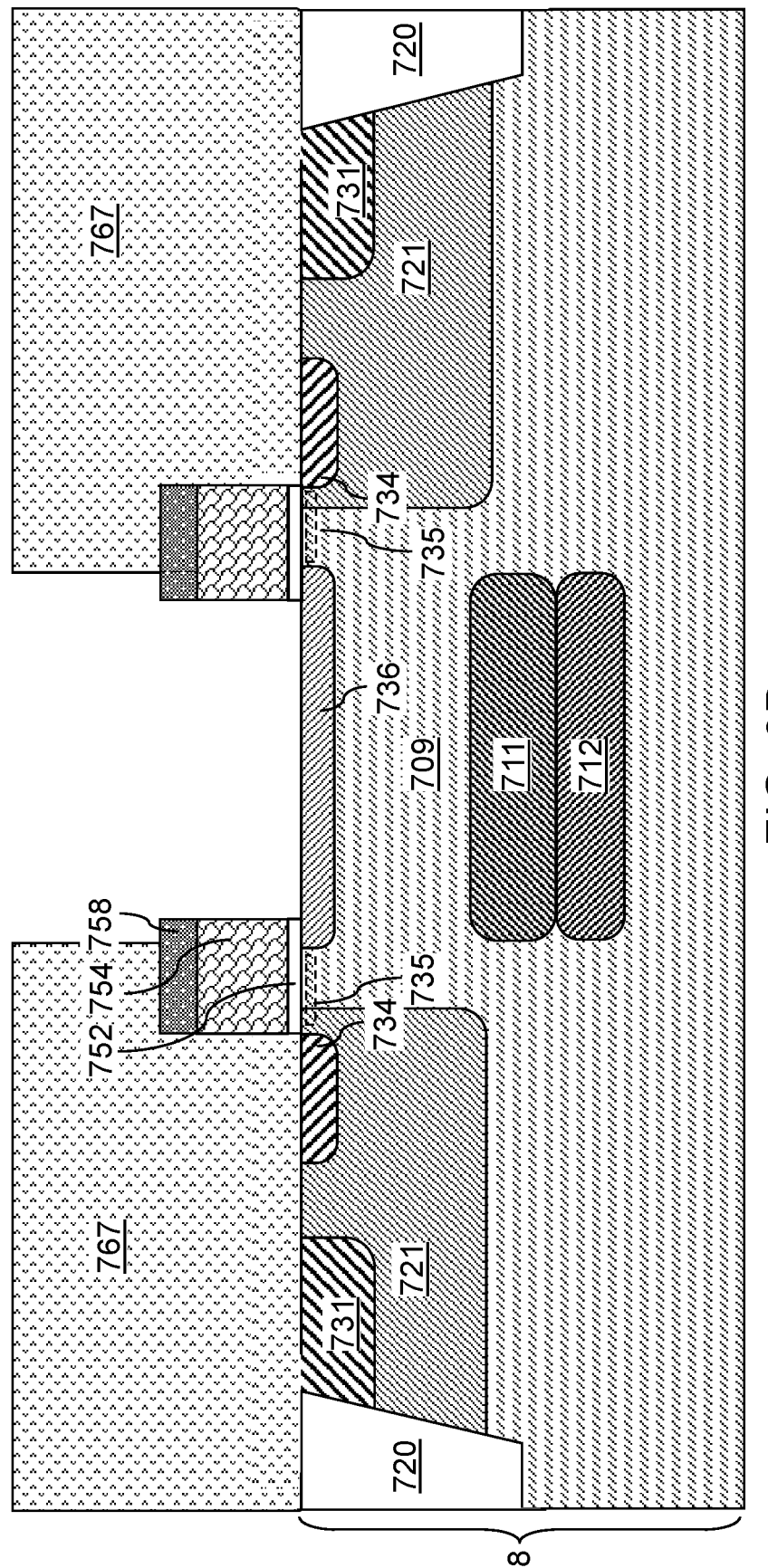
FIG. 9B is a vertical cross-sectional view of the ninth exemplary structure after formation of a buried first-conductivity-type well and a buried second-conductivity-type well according to an embodiment of the present disclosure.

Referring to FIG. 9B, a photoresist layer 767 may be formed over the semiconductor substrate 8 and the gate electrode(s) 754, and may be lithographically patterned to form an opening between gate electrodes 754 or between a gate electrode 754 and a shallow trench isolation structure 720. Dopants of the first conductivity type may be implanted into portions of the body semiconductor layer 709 that are not masked by the photoresist layer 767 or the gate electrode(s) 754 to form a buried first conductivity-type well 711. The buried first-conductivity-type well 711 may have a lateral extent that is limited by the lateral distance between two gate electrodes 754 or by the lateral distance between the gate electrode 754 and a shallow trench isolation structure 720. The depth and the material composition of the buried first-conductivity-type well 711 may be the same as in the first exemplary structure. Dopants of the second conductivity type may be implanted into portions of the body semiconductor layer 709 that are not masked by the photoresist layer 767 or the gate electrode(s) 754 to form a buried second conductivity-type well 712. The buried second-conductivity-type well 712 may have a lateral extent that is limited by the lateral distance between two gate electrodes 754 or by the lateral distance between the gate electrode 754 and a shallow trench isolation structure 720. The depth and the material composition of the buried second-conductivity-type well 712 may be the same as in the first exemplary structure. The buried second-conductivity-type well 712 underlies the buried first-conductivity-type well 711, and forms a p-n junction with the buried first-conductivity-type well 711. Each source-side first conductivity type well 721 may be laterally spaced from the buried first-conductivity-type well 711 by a portion of the body semiconductor layer 709 that underlies a gate dielectric 752.

Figure 9C:
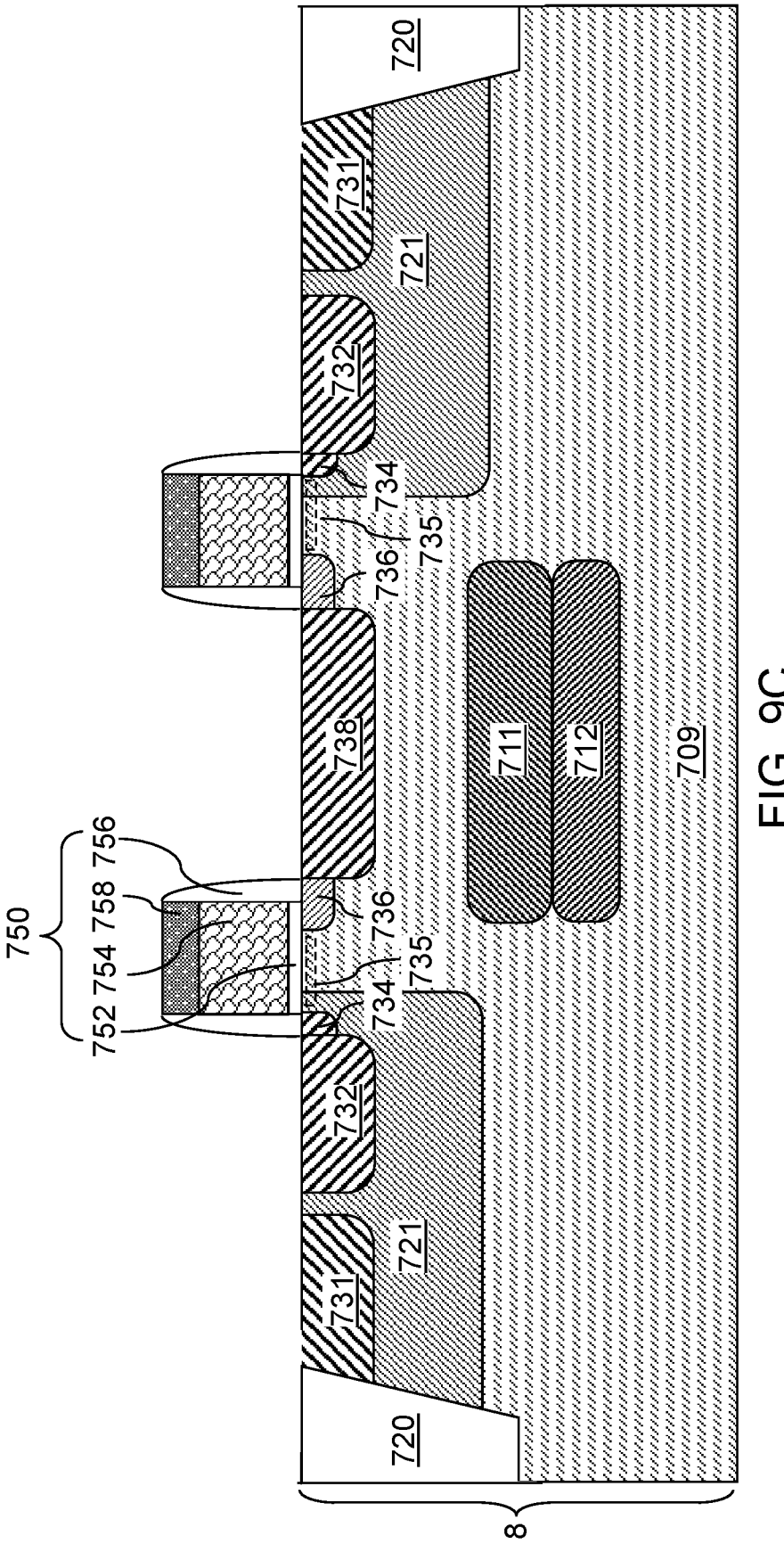
FIG. 9C is a vertical cross-sectional view of the ninth exemplary structure after formation of at least one source extension region, dielectric gate spacers, at least one deep source region, and a deep drain region according to an embodiment of the present disclosure.

Referring to FIG. 9C, the processing steps of FIGS. 1F and 1G-1I may be performed to form dielectric gate spacers 756, at least one deep source region 732, and a deep drain region 738. The drain region (736, 738) forms a p-n junction with the body semiconductor layer 709. The buried first-conductivity-type well 711 has an areal overlap with the drain region (736, 738), and does not have an areal overlap with the doped body contact region 731 in a plan view. In one embodiment, the buried first-conductivity-type well 711 may have an areal overlap with the entirety of the drain region (736, 738), and does not have any areal overlap with the doped body contact region 731 or with the at least one source region (732, 734) in the plan view. The source-side first-conductivity-type well 721 laterally surrounds the source region (732, 734) and forms a p-n junction with the source region (732, 734). A channel region 735 underlies a gate dielectric 752, and laterally extends through an upper portion of the source-side first-conductivity-type well 721 and through an upper portion of the body semiconductor layer 709.

Figure 9D:
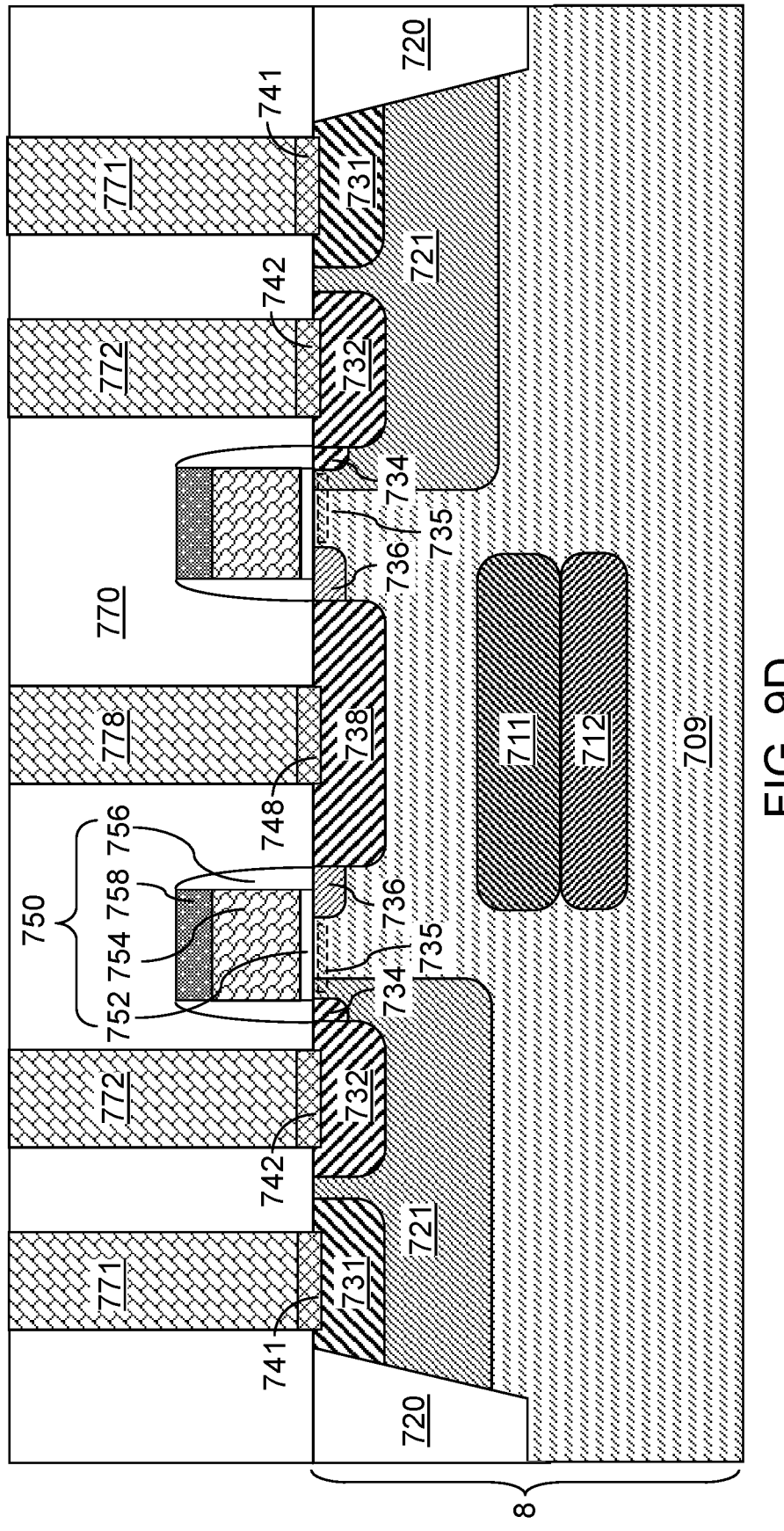
FIG. 9D is a vertical cross-sectional view of the ninth exemplary structure after formation of a contact-level dielectric layer, various metal-semiconductor alloy portions, and various contact via structures according to an embodiment of the present disclosure.

Referring to FIG. 9D, the processing steps of FIGS. 1G-1I may be performed to form a contact-level dielectric layer 770, metal-semiconductor alloy portions (741, 742, 748), and contact via structures (771, 772, 778).

The field effect transistor may have a configuration that causes more than 90% (which may be more than 95% and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the drain region (736, 738). The drain region (736, 738) may include a drain extension region 736 and a deep drain region 738 having a greater depth than the drain extension region 736. In one embodiment, the field effect transistor may have a configuration that causes more than 90% (which may be more than 95%, and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the deep drain region 738. The bottom surface of the deep drain region 738 may be located at a greater depth than the bottom surface of the drain extension region 736. Less than 10% (which may be less than 5%, and/or less than 2%, and/or less than 1%) of the electrical charges may impinge on a sidewall surface of the p-n junction between the drain region (736, 738) located above the bottommost surface of the drain region (736, 738), which is the bottom surface of the deep drain region 738.

The ninth exemplary structure is an alternative configuration of any of the first through eighth exemplary structures.

Figure 10:
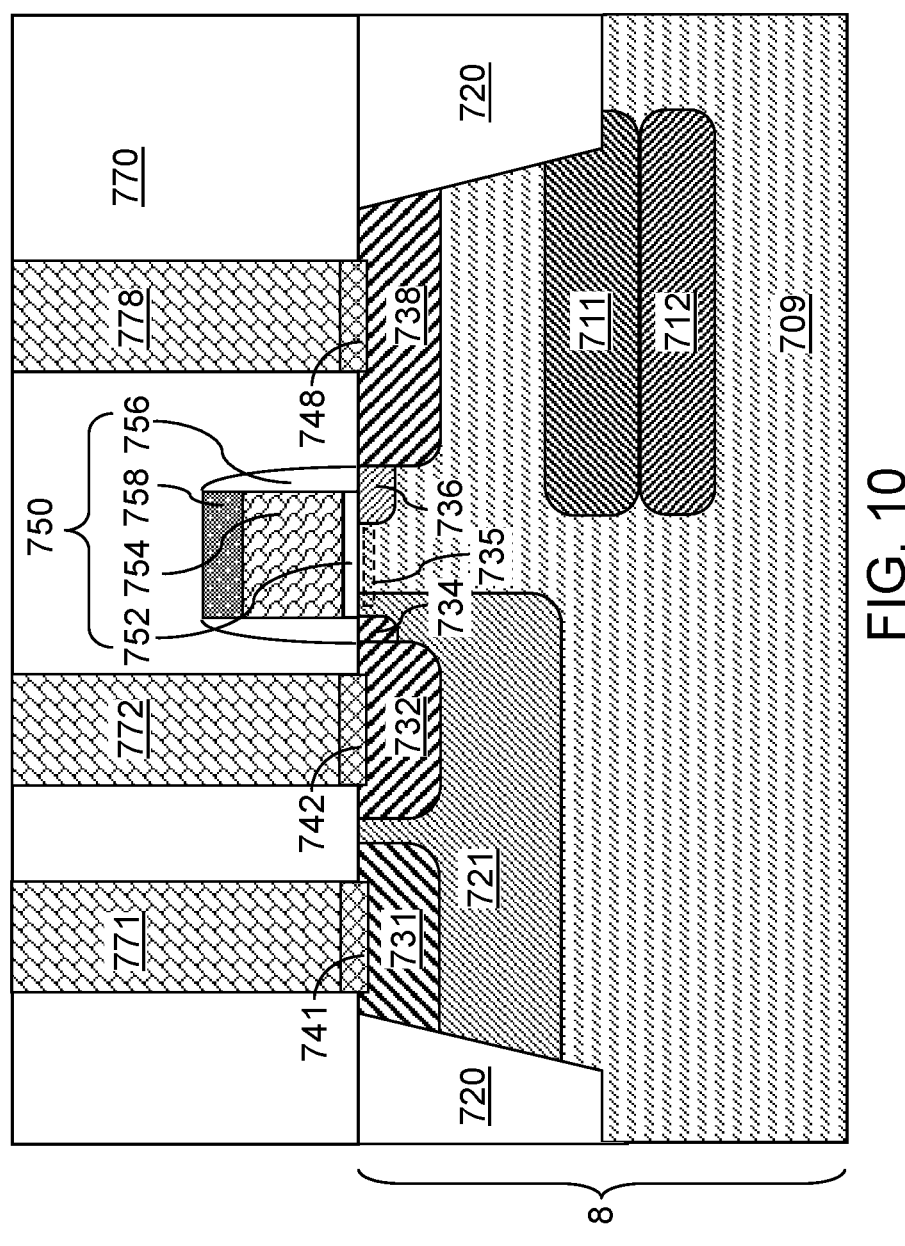
FIG. 10 is a vertical cross-sectional view of a tenth exemplary structure according to an embodiment of the present disclosure.

Referring to FIG. 10, a tenth exemplary structure according to an embodiment of the present disclosure may be derived from the ninth exemplary structure by changing the layout of the source region (732, 734), the drain region (736, 738), and the doped body contact region 731. Specifically, the doped body contact region 731, the source region (732, 734), and the drain region (736, 738) may be arranged along a horizontal direction with a uniform width throughout, which is the lateral separation distance of two parallel portions of the shallow trench isolation structure 720. In this case, the buried first-conductivity-type well 711 and the buried second-conductivity-type well 712 may underlie the drain region (736, 738) and extend to a region that underlies a sidewall of a shallow trench isolation structure 720. The tenth exemplary structure is an alternative configuration of any of the first through ninth exemplary structures.

Figure 11:
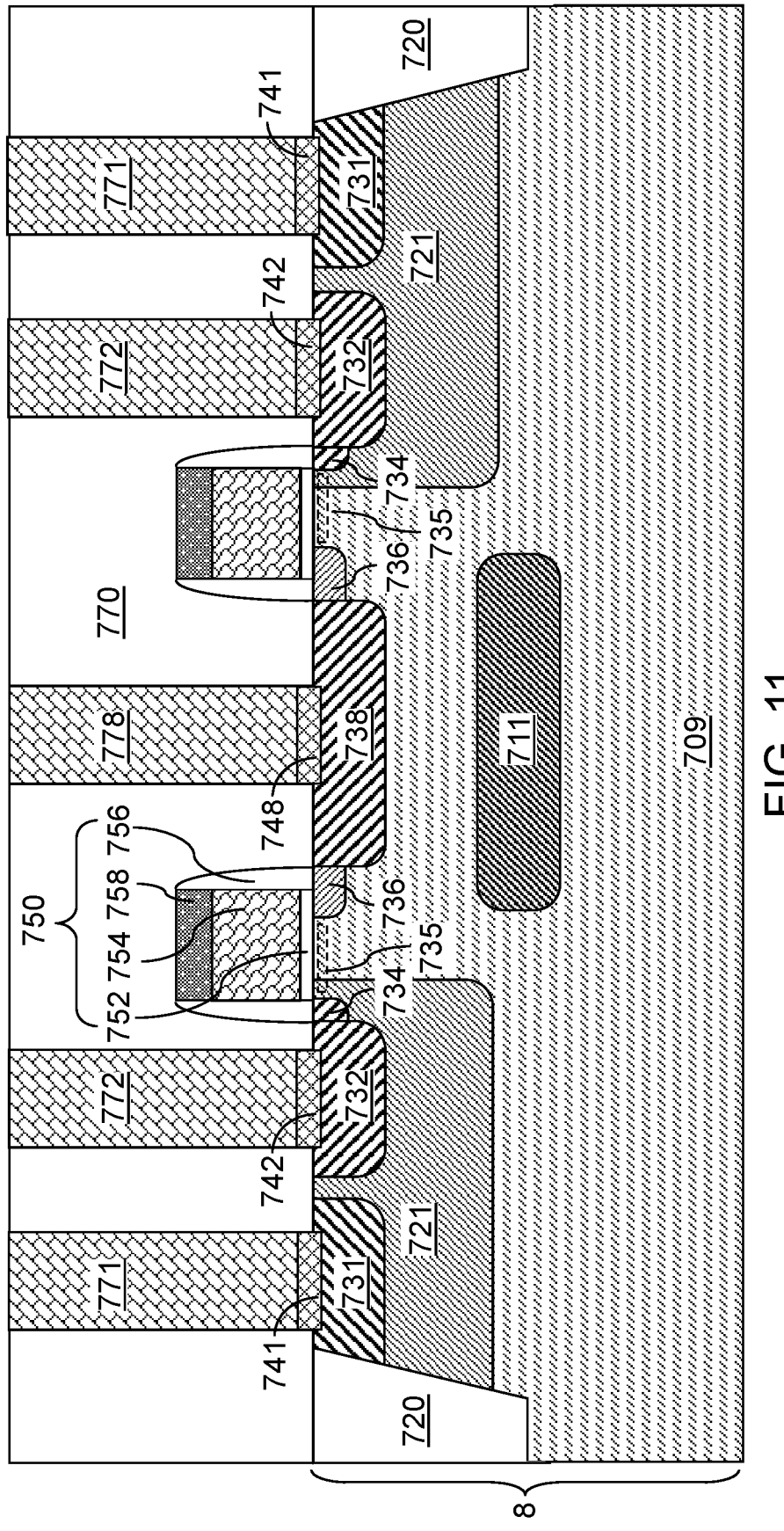
FIG. 11 is a vertical cross-sectional view of an eleventh exemplary structure according to an embodiment of the present disclosure.

Referring to FIG. 11, an eleventh exemplary structure according to an embodiment of the present disclosure may be derived from the ninth exemplary structure by omitting formation of the buried second-conductivity-type well 712. In this case, a horizontal bottom surface of the buried first-conductivity-type well 711 may contact a horizontal surface of the body semiconductor layer 709. The eleventh exemplary structure is an alternative configuration of any of the first through tenth exemplary structures.

Figure 12:
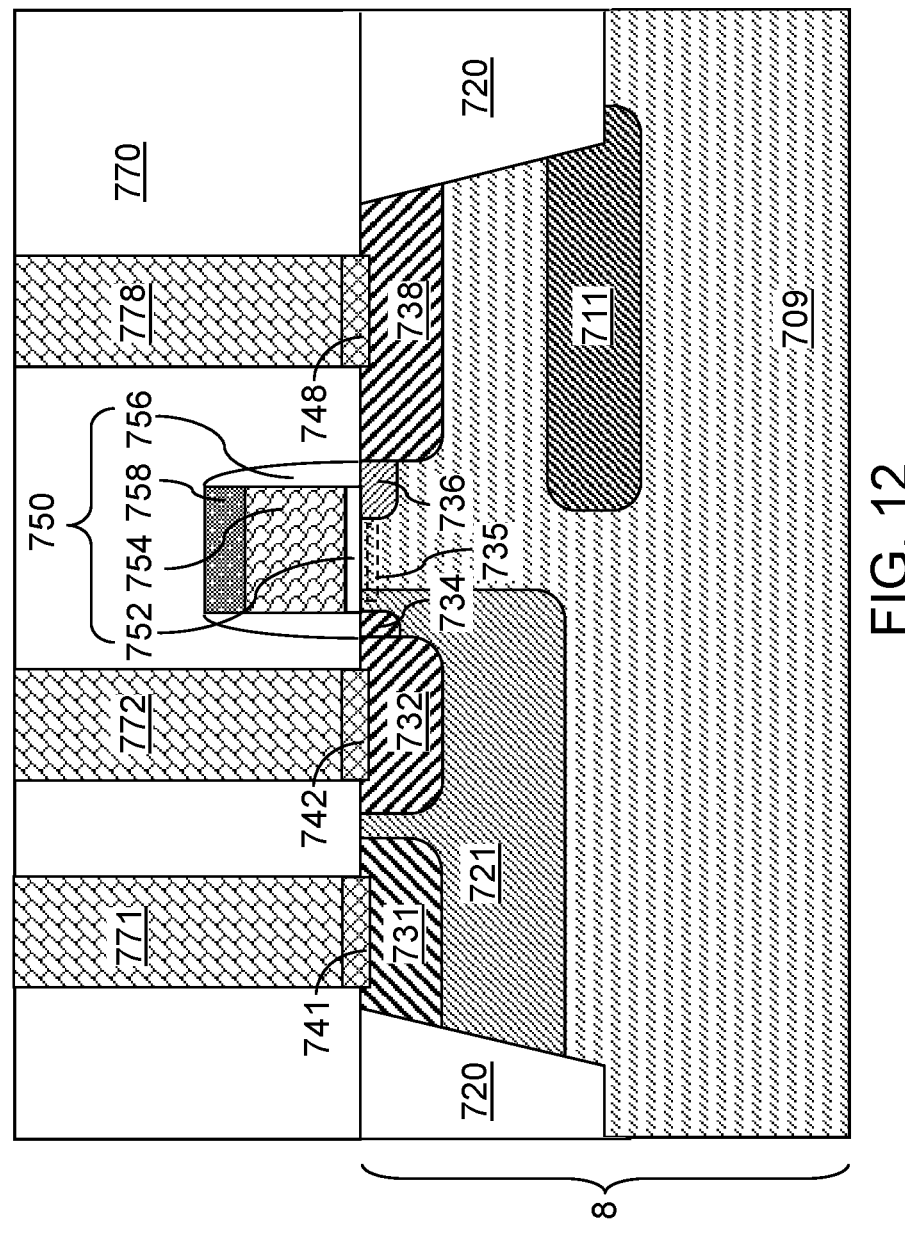
FIG. 12 is a vertical cross-sectional view of a twelfth exemplary structure according to an embodiment of the present disclosure.

Referring to FIG. 12, a twelfth exemplary structure according to an embodiment of the present disclosure may be derived from the tenth exemplary structure by omitting formation of the buried second-conductivity-type well 712. In this case, a horizontal bottom surface of the buried first-conductivity-type well 711 may contact an underlying portion of the body semiconductor layer 709. Alternatively, the twelfth exemplary structure may be derived from the eleventh exemplary structure by changing the layout of the source region (732, 734), the drain region (736, 738), and the doped body contact region 731. The twelfth exemplary structure is an alternative configuration of any of the first through eleventh exemplary structures.

Figure 13:
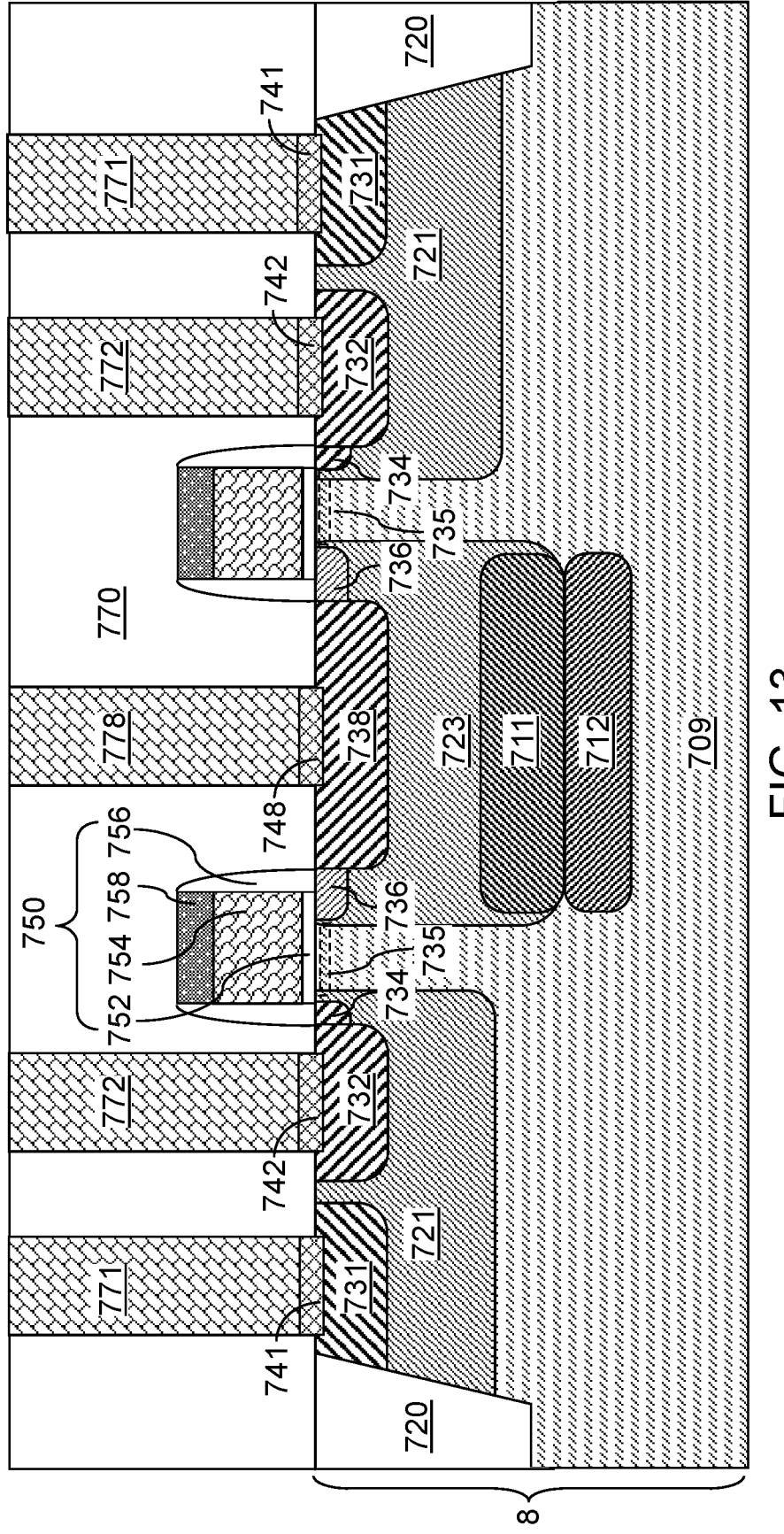
FIG. 13 is a vertical cross-sectional view of a thirteenth exemplary structure according to an embodiment of the present disclosure.

Referring to FIG. 13, a thirteenth exemplary structure according to an embodiment of the present disclosure may be derived from the ninth exemplary structure by forming a drain-side first-conductivity-type well 723. The drain-side first conductivity-type well 723 may be formed using a same ion implantation mask as the drain extension region 736. For example, dopants of the first conductivity type may be implanted while the ion implantation mask (such as a patterned photoresist layer) for forming the drain extension region 736 is present over the front surface of the semiconductor substrate 8. The energy of the ion implantation process that forms the drain-side first conductivity-type well 723 is selected such that the drain-side first conductivity-type well 723 continuously extends from below the bottom surface of the drain region (736, 738) to the top surface of the buried first-conductivity-type well 711.

The dose of the ion implantation process that forms the drain-side first-conductivity-type well 723 may be selected such that the average dopant concentration in the drain-side first-conductivity-type well 723 is in a range from $1.0 \times 10^{16}/cm^3$ to $3.0 \times 10^{18}/cm^3$. The average atomic concentration of the dopants of the first conductivity type in the drain-side first-conductivity-type well 723 is higher than the atomic concentration of dopants of the first conductivity type in the body semiconductor layer 709. The average dopant concentration of the dopants of the first conductivity type in the drain-side first-conductivity-type well 723 is selected to function as a conductive path for high energy charge carriers during an avalanche breakdown condition, and does not function as a conductive path for low energy charge carriers during normal operation of the field effect transistor. The drain-side first-conductivity-type well 723 overlies, and contacts, the buried first-conductivity-type well 711, and have a lower atomic concentration of dopants of the first conductivity type than the buried first-conductivity-type well 711. The source-side first conductivity type well 721 may be laterally spaced from the buried first-conductivity-type well 711 and the drain-side first-conductivity-type well 723 by a portion of the body semiconductor layer 709 that underlies a gate dielectric 752. In an alternative embodiment, the drain-side first-conductivity-type well 723 may be formed at the processing steps of FIG. 9B using the patterned photoresist layer 767 as an ion implantation mask layer.

The field effect transistor may have a configuration that causes more than 90% (which may be more than 95% and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the drain region (736, 738). The drain region (736, 738) may include a drain extension region 736 and a deep drain region 738 having a greater depth than the drain extension region 736. In one embodiment, the field effect transistor may have a configuration that causes more than 90% (which may be more than 95%, and/or more than 98%, and/or more than 99%) of impact ionization electrical charges during avalanche breakdown to flow from the source region (732, 734), to pass through the buried first-conductivity-type well 711, and to impinge on a horizontal surface of the p-n junction that is a bottom surface of the deep drain region 738. The bottom surface of the deep drain region 738 may be located at a greater depth than the bottom surface of the drain extension region 736. Less than 10% (which may be less than 5%, and/or less than 2%, and/or less than 1%) of the electrical charges may impinge on a sidewall surface of the p-n junction between the drain region (736, 738) located above the bottommost surface of the drain region (736, 738), which is the bottom surface of the deep drain region 738. The thirteenth exemplary structure is an alternative configuration of any of the first through twelfth exemplary structures.

Figure 14:
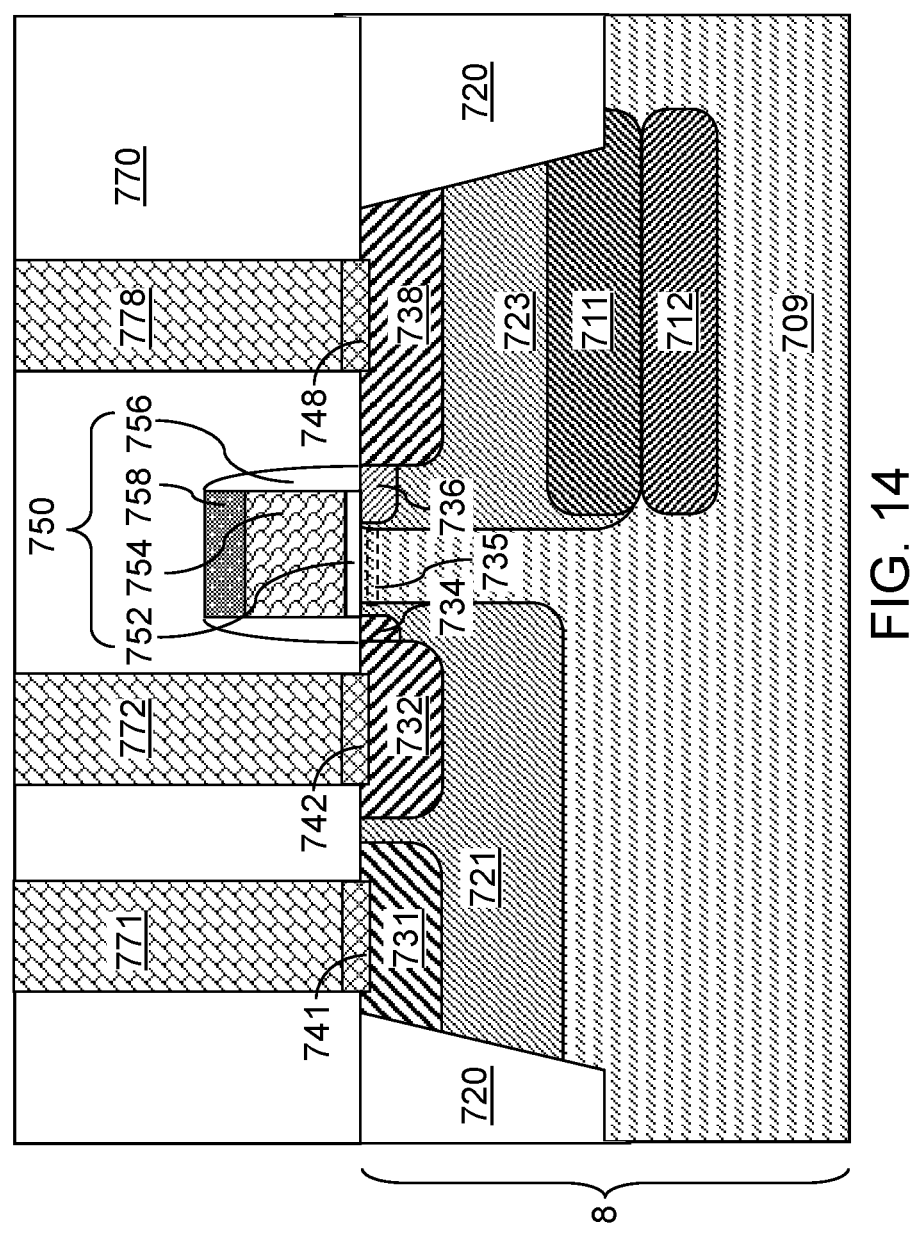
FIG. 14 is a vertical cross-sectional view of a fourteenth exemplary structure according to an embodiment of the present disclosure.

Referring to FIG. 14, the fourteenth exemplary structure according to an embodiment of the present disclosure may be derived from the thirteenth exemplary structure by changing the layout of the source region (732, 734), the drain region (736, 738), and the doped body contact region 731. Specifically, the doped body contact region 731, the source region (732, 734), and the drain region (736, 738) may be arranged along a horizontal direction with a uniform width throughout, which is the lateral separation distance of two parallel portions of the shallow trench isolation structure 720. In this case, the buried first-conductivity-type well 711 and the buried second-conductivity-type well 712 may underlie the drain region (736, 738) and extend to a region that underlies a sidewall of a shallow trench isolation structure 720. The fourteenth exemplary structure is an alternative configuration of any of the first through thirteenth exemplary structures.

Figure 15:
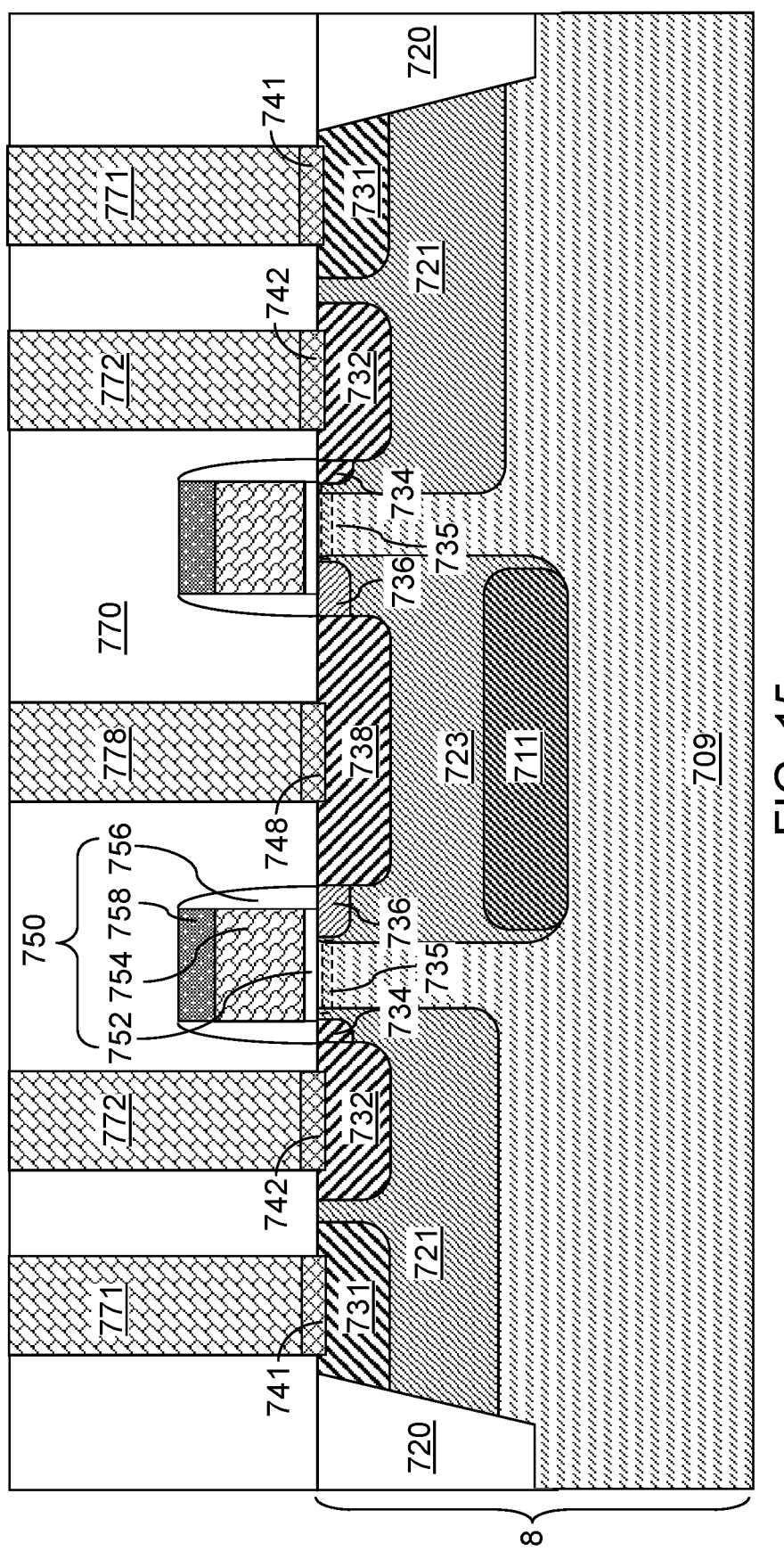
FIG. 15 is a vertical cross-sectional view of a fifteenth exemplary structure according to an embodiment of the present disclosure.

Referring to FIG. 15, an fifteenth exemplary structure according to an embodiment of the present disclosure may be derived from the thirteenth exemplary structure by omitting formation of the buried second-conductivity-type well

712. In this case, a horizontal bottom surface of the buried first-conductivity-type well 711 may contact a horizontal surface of the body semiconductor layer 709. The fifteenth exemplary structure is an alternative configuration of any of the first through fourteenth exemplary structures.

Figure 16:
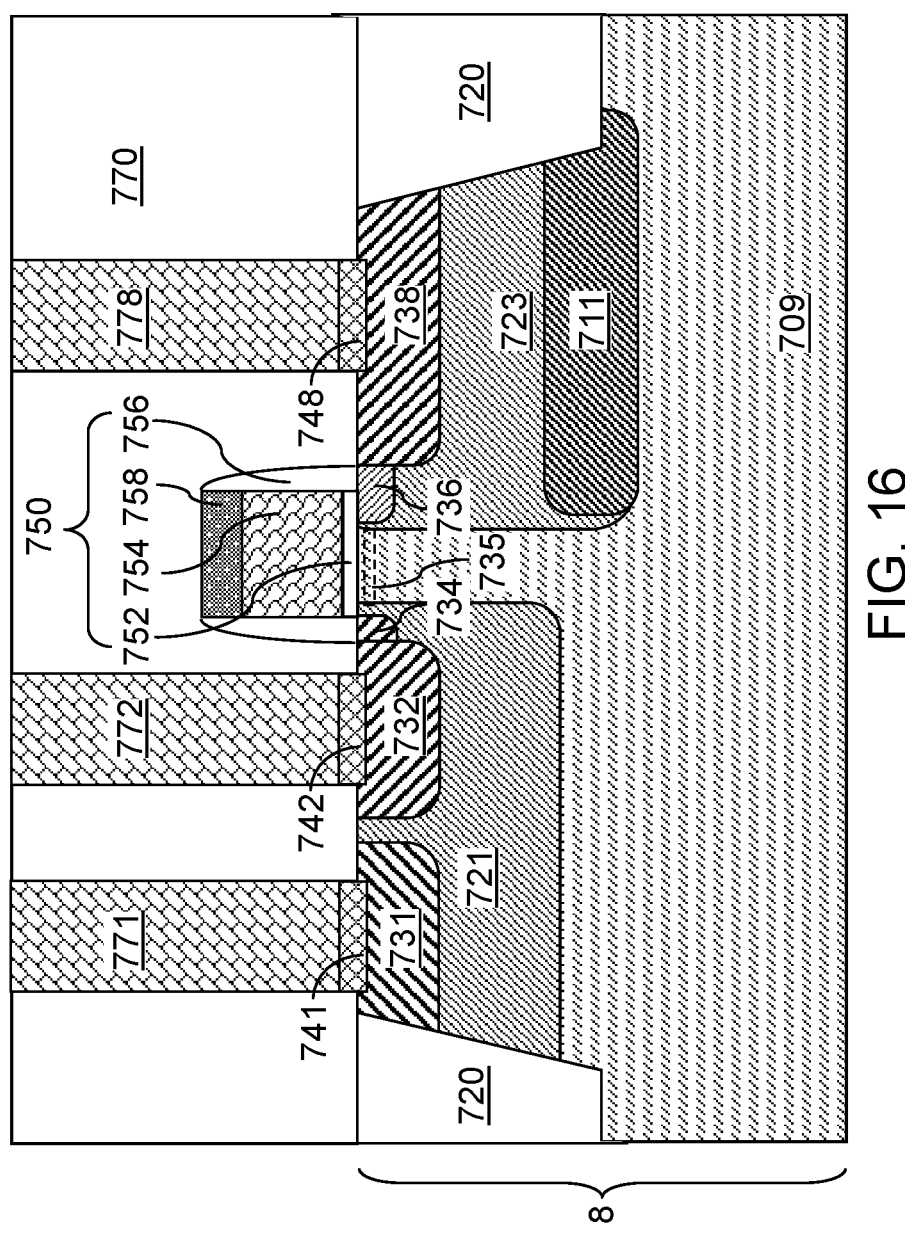
FIG. 16 is a vertical cross-sectional view of a sixteenth exemplary structure according to an embodiment of the present disclosure.

Referring to FIG. 16, a sixteenth exemplary structure according to an embodiment of the present disclosure may be derived from the fourteenth exemplary structure by omitting formation of the buried second-conductivity-type well 712. In this case, a horizontal bottom surface of the buried first-conductivity-type well 711 may contact a horizontal surface of the body semiconductor layer 709. The sixteenth exemplary structure is an alternative configuration of any of the first through fifteenth exemplary structures.

Generally speaking, each of the various exemplary structures described above may include a field effect transistor. The field effect transistor may comprise: a body semiconductor layer 709 located in a semiconductor substrate 8 and having a doping of a first conductivity type; a source region (732, 734) and a drain region (736, 738) formed in an upper portion of the semiconductor substrate 8, having a doping of a second conductivity type that is an opposite of the first conductivity type, and laterally spaced apart by a channel region 735; a doped body contact region 731 formed in the upper portion of the semiconductor substrate 8, having a doping of the first conductivity type, and spaced from the source region (732, 734); and a buried first-conductivity-type well 711 located within the semiconductor substrate 8, underlying, and having an areal overlap in a plan view with, the drain region (736, 738), vertically spaced apart from the drain region (736, 738), and having a higher atomic concentration of dopants of the first conductivity type than the body semiconductor layer 709.

In one embodiment, a source-side first-conductivity-type well 721 may be located within the semiconductor substrate 8, and may have a higher concentration of dopants of the first conductivity type than the body semiconductor layer 709. In one embodiment, the source-side first-conductivity-type well 721 connects the doped body contact region 731 and the buried first-conductivity-type well 711. In one embodiment, the source-side first-conductivity-type well 721 laterally surrounds the source region (732, 734) and forms a p-n junction with the source region (732, 734); and a channel region 735 underlying a gate dielectric 752 laterally extends through an upper portion of the source-side first-conductivity-type well 721 and through an upper portion of the body semiconductor layer 709.

In one embodiment, the source-side first conductivity type well 721 is laterally spaced from the buried first-conductivity-type well 711 by a portion of the body semiconductor layer 709 that underlies a gate dielectric 752.

In one embodiment, the source region (732, 734) and the drain region (736, 738) have asymmetric extension regions such that a drain extension region 736 has a greater areal overlap with a gate electrode 754 in a plan view than a source extension region 734 has with the gate electrode 754 in the plan view.

In one embodiment, the drain region (736, 738) forms a p-n junction with the body semiconductor layer 709 or a drain-side first-conductivity-type well 723 that overlies the buried first-conductivity-type well 711 and having a lower atomic concentration of dopants of the first conductivity type than the buried first-conductivity-type well 711.

In one embodiment, the field effect transistor has a configuration that causes more than 90% of impact ionization electrical charges during avalanche breakdown to flow from the source region (732, 734), to pass through the buried first-conductivity-type well 711, and to impinge on a horizontal surface of the p-n junction that is a bottom surface (which is the bottommost surface) of the drain region (736, 738), and less than 10% of the electrical charges to impinge on a sidewall surface of the p-n junction.

In one embodiment, the buried first-conductivity-type well 711 has an areal overlap with an entirety of areas of the source region (732, 734), the drain region (736, 738), and the doped body contact region 731 in a plan view.

In one embodiment, a shallow trench isolation structure 720 may laterally surrounds the source region (732, 734), the drain region (736, 738), and the doped body contact region 731. The entirety of a closed periphery of an interface between a top surface of the buried first-conductivity-type well 711 and the body semiconductor layer 709 continuously contacts sidewalls of the shallow trench isolation structure 720.

In one embodiment, the buried first-conductivity-type well 711 has an areal overlap with the entirety of an area of the drain region (736, 738) in a plan view, and does not overlap with an area of the doped body contact region 731 in the plan view.

In one embodiment, a buried second-conductivity-type well 712 may underlie the buried first-conductivity-type well 711, and may form a p-n junction with the buried first-conductivity-type well 711.

Additional metal interconnect structures may be formed in dielectric material layers over any of the exemplary structures described above.

Figure 17:
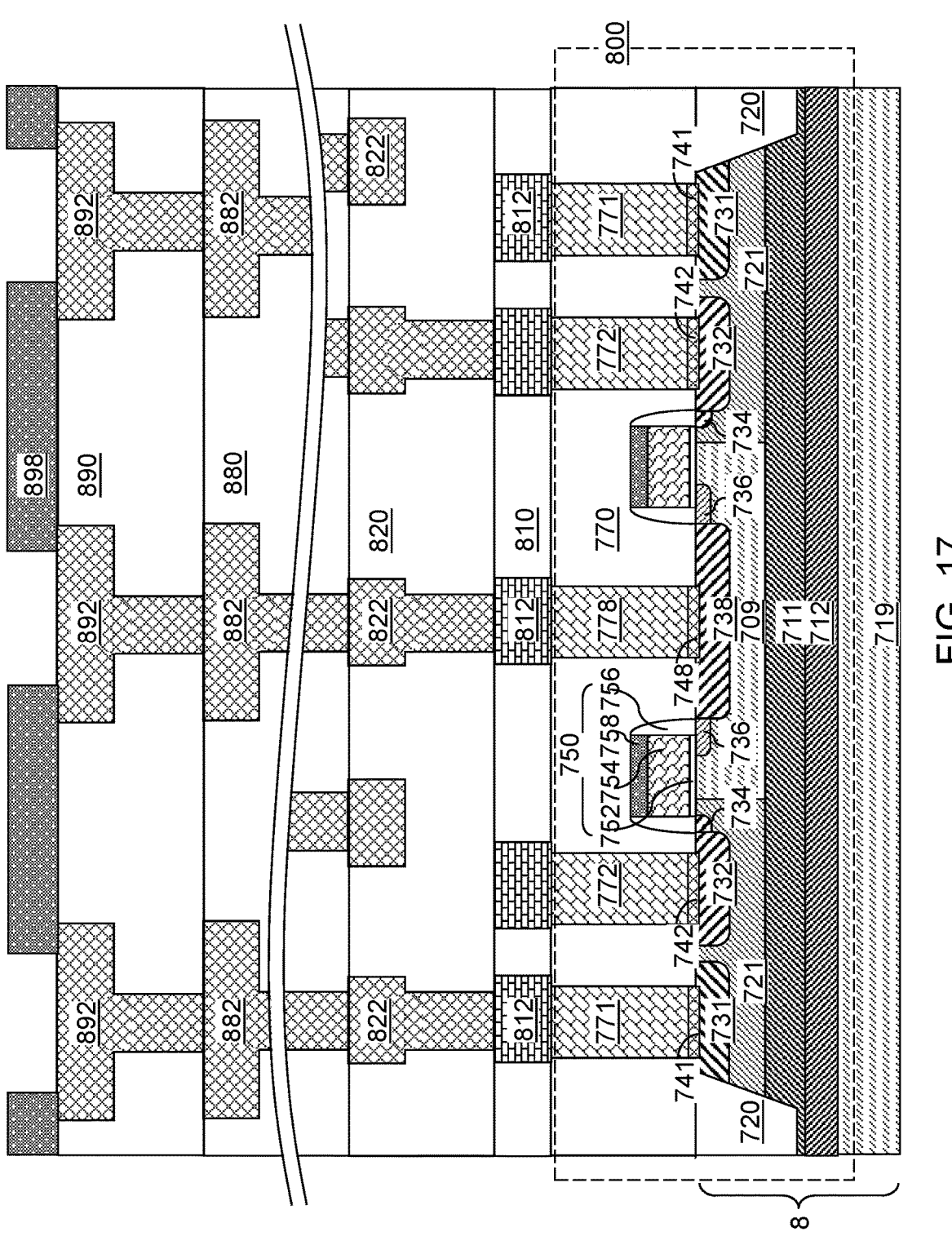
FIG. 17 is a vertical cross-sectional view of an exemplary structure after formation of metal interconnect structures, dielectric material layers, bonding pads, and a passivation dielectric layer according to an embodiment of the present disclosure.

Referring to FIG. 17, an exemplary structure according to an embodiment of the present disclosure is illustrated, which may be derived from any of the above-described exemplary structures by forming metal interconnect structures (812, 822, 882, 892) formed in dielectric material layers (810, 820, 880, 890) over each field effect transistor 800. Each field effect transistor 800 is an avalanche-protected field effect transistor, i.e., a field effect transistor configured to provide device protection in the event of an avalanche breakdown. Specifically, the gate dielectric 752 of each avalanche-protected field effect transistor is protected from impinging charge carriers during an avalanche breakdown event by inducing the charge carriers to pass through the buried first-conductivity-type well 711 and onto a bottommost surface of a drain region (736, 738), which is the bottom surface of the deep drain region 738.

The metal interconnect structures (812, 822, 882, 892) may include first metal lines 812 formed in a first line-level dielectric layer 810, second integrated line and via structures 822 formed in a second line-and-via-level dielectric layer 820, additional integrated line and via structures (not shown) formed in additional line-and-via-level dielectric layers (not shown), terminal integrated line and via structures 882 formed in a terminal line-and-via-level dielectric layer 880, bonding pads 892 formed in a bonding-pad-level dielectric layer 890. A passivation dielectric layer 898 including openings that overlie the bonding pads 892 may be formed over the bonding-pad-level dielectric layer 890.

Figure 18:
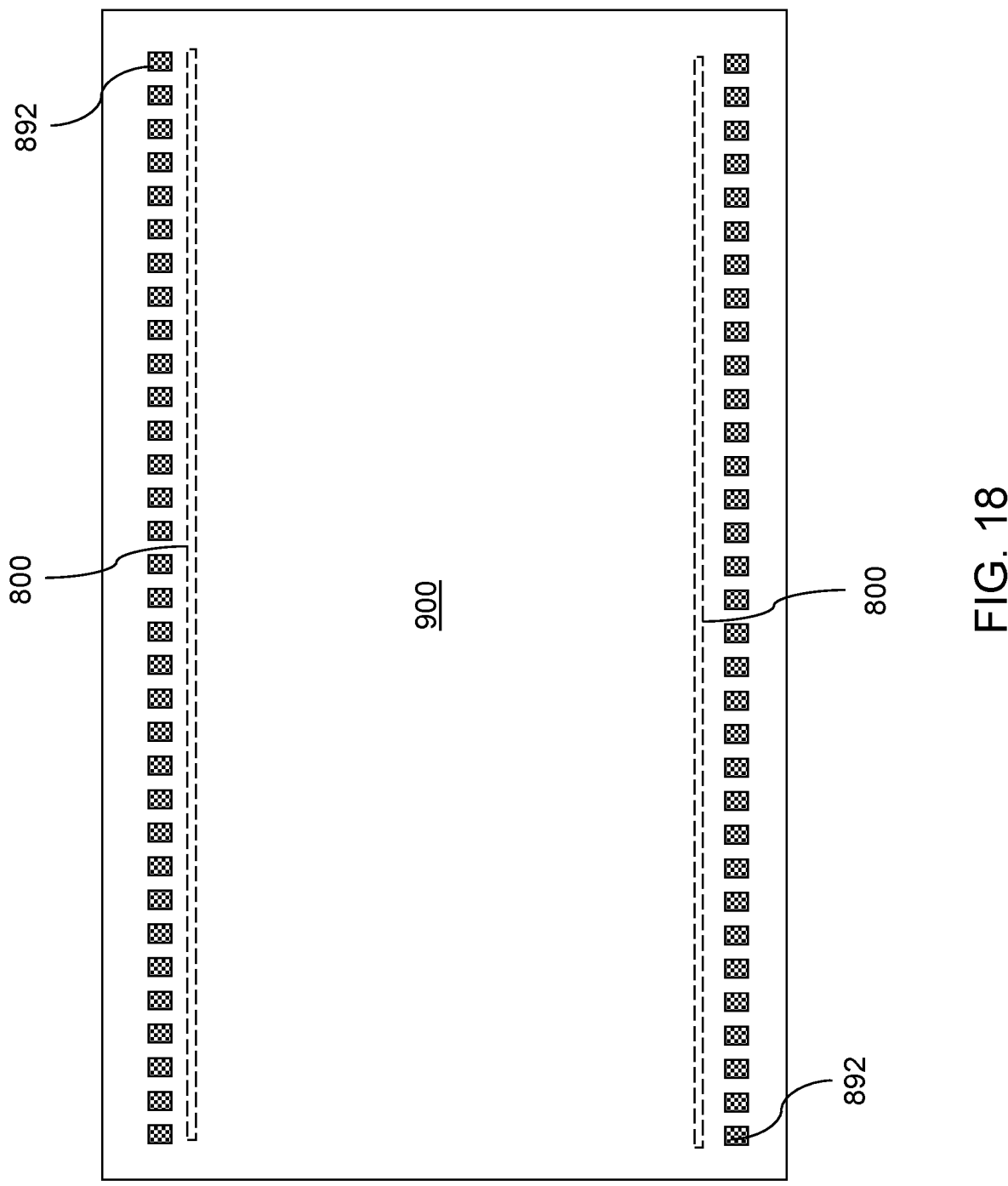
FIG. 18 is a top-down view of a semiconductor chip incorporating any of the above exemplary structures therein according to an embodiment of the present disclosure.

Referring to FIG. 18, a semiconductor chip 900 incorporating the exemplary structure of FIG. 17 is illustrated. The semiconductor chip 900 may include a plurality of field effect transistors 800 illustrated in FIG. 17. Each of the plurality of field effect transistors 800 in the semiconductor chip 900 may be an avalanche-protected field effect transistor.

Generally, a semiconductor chip 900 may comprise at least one avalanche-protected field effect transistor 800 located in a semiconductor substrate 8. Each of the at least one avalanche-protected field effect transistor 800 comprises: a body semiconductor layer 709 located in a semiconductor substrate 8 and having a doping of a first conductivity type; a source region (732, 734) and a drain region (736, 738) formed in an upper portion of the semiconductor substrate 8, having a doping of a second conductivity type that is an opposite of the first conductivity type, and laterally spaced apart by a channel region 735; and a buried first-conductivity-type well 711 located within the semiconductor substrate 8, underlying, and having an areal overlap in a plan view with, the drain region (736, 738), vertically spaced apart from the drain region (736, 738) (by a laterally-extending portion of the body semiconductor layer 709 or by a drain-side first-conductivity-type well 723), and having a higher atomic concentration of dopants of the first conductivity type than the body semiconductor layer 709. Each of the at least one avalanche-protected field effect transistor 800 has a configuration that induces more than 90% of impact ionization electrical charges during avalanche breakdown to flow from the source region (732, 734), to pass through the buried first-conductivity-type well 711, and to impinge on a horizontal surface of a p-n junction that is a bottom surface of the drain region (736, 738), and less than 10% of the electrical charges to impinge on a sidewall surface of the p-n junction.

In one embodiment, each of the at least one avalanche-protected field effect transistor 800 comprises a doped body contact region 731 formed in the upper portion of the semiconductor substrate 8, having a doping of the first conductivity type, and spaced from the source region (732, 734). In one embodiment, each of the at least one avalanche-protected field effect transistor 800 comprise source-side first-conductivity-type well 721 located within the semiconductor substrate 8, having a higher atomic higher atomic concentration of dopants of the first conductivity type than the body semiconductor layer 709.

In one embodiment, the source-side first-conductivity-type well 721 connects the doped body contact region 731 and the buried first-conductivity-type well 711 within each of the at least one avalanche-protected field effect transistor 800. In one embodiment, each of the at least one avalanche-protected field effect transistor 800 comprises a buried second-conductivity-type well 712 underlying, and forming a p-n junction with, the buried first-conductivity-type well 711 of a respective avalanche-protected field effect transistor 800.

Figure 19:
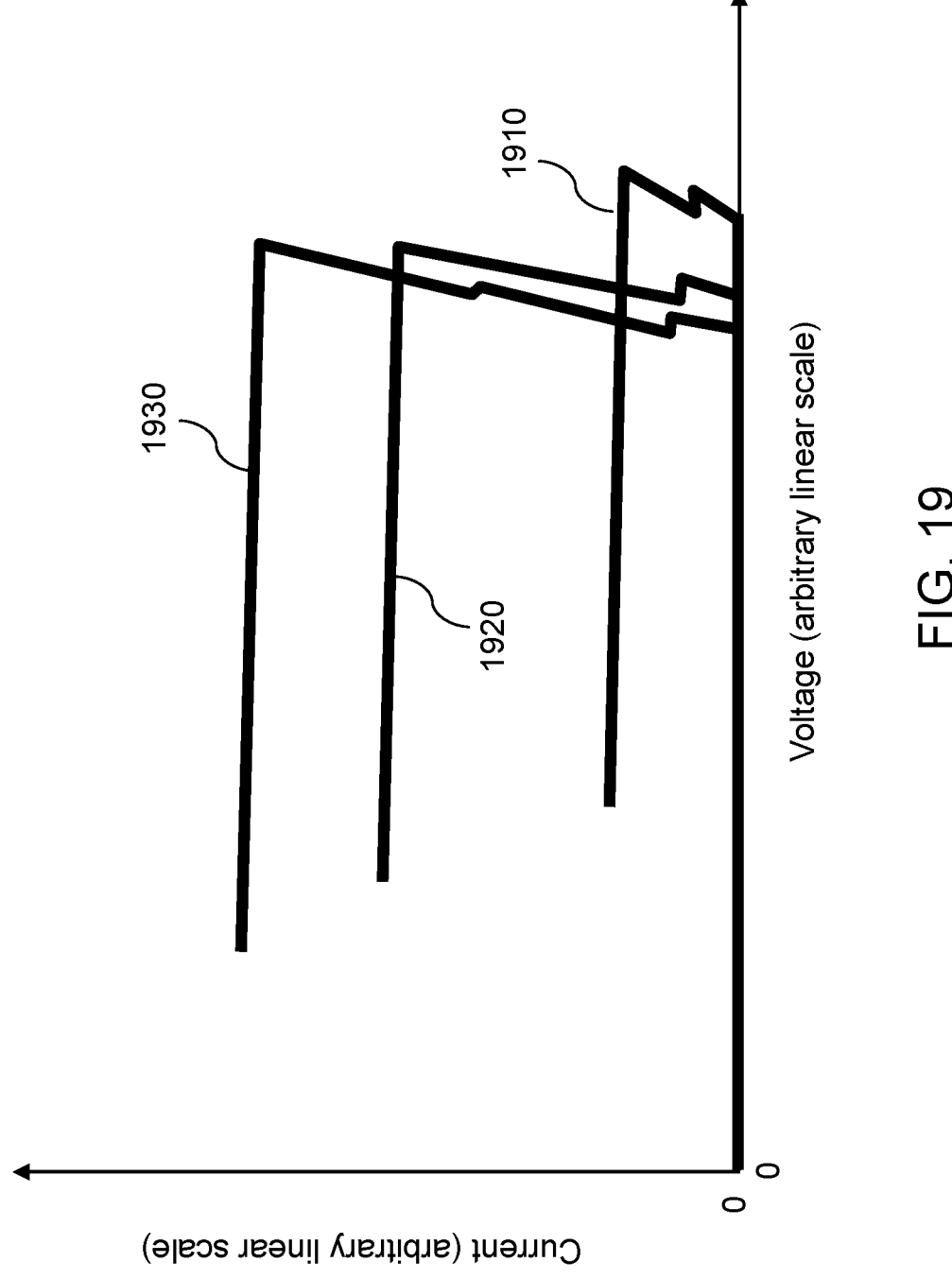
FIG. 19 is a voltage-current plot during an avalanche breakdown for test samples embodying the exemplary structures of the present disclosure and for a comparative exemplary test sample.

Referring to FIG. 19, a voltage-current plot is illustrated during an avalanche breakdown for test samples embodying the exemplary structures of the present disclosure and for a comparative exemplary test sample. Curve 1910 represents a current-voltage curve during avalanche breakdown of the comparative exemplary test sample that is derived from the second exemplary structure of FIG. 4 by removing the buried first-conductivity-type well 711 and the source-side first-conductivity-type well 721. Curves 1920 and 1930 represents current-voltage curves during avalanche breakdown of the exemplary test samples embodying the second exemplary structure of FIG. 4 with different implant conditions for buried first-conductivity-type well 711 and the source-side first-conductivity-type well 721. The presence of the buried first-conductivity-type well 711 and the source-side first-conductivity-type well 721 causes the breakdown voltage to be reduced by about 10%. However, the magnitude of current during the avalanche breakdown increases by a factor in a range from 2.5 to 4.0 when the buried first-conductivity-type well 711 and the source-side first-conductivity-type well 721 are present within the field effect transistor. Thus, the field effect transistors of the embodiments of the present disclosure provide enhanced protection against avalanche breakdown.

According to an embodiment of the present disclosure, device transmission line pulse snapback current is improved by using bottom avalanche breakdown structure of embodiments of the present disclosure. Transmission line pulse (TLP) measurement method is a measurement method used for characterizing electrostatic discharge (ESD) performance of devices under stresses. A short pulse width and fast rise time are used to imitate the pulse conditions during electrostatic discharge events. As demonstrated in curves 1920 and 1930, embodiments of the present disclosure may improve ESD performance of a field effect transistor and improve unclamped inductive switching performance. It is believed that further improvements may be made by optimizing the energy and the dosage for the implantation process for forming the buried first-conductivity-type well 711.

FIGS. 20A-20D are flow charts of steps for forming an avalanche-protected field effect transistor of the present disclosure according to an embodiment of the present disclosure. The processing sequences in the flow charts differ from one another by the timing of performing the processing step 2090, in which a buried first-conductivity-type well 711 is formed within the semiconductor substrate 8.

Figure 20D:
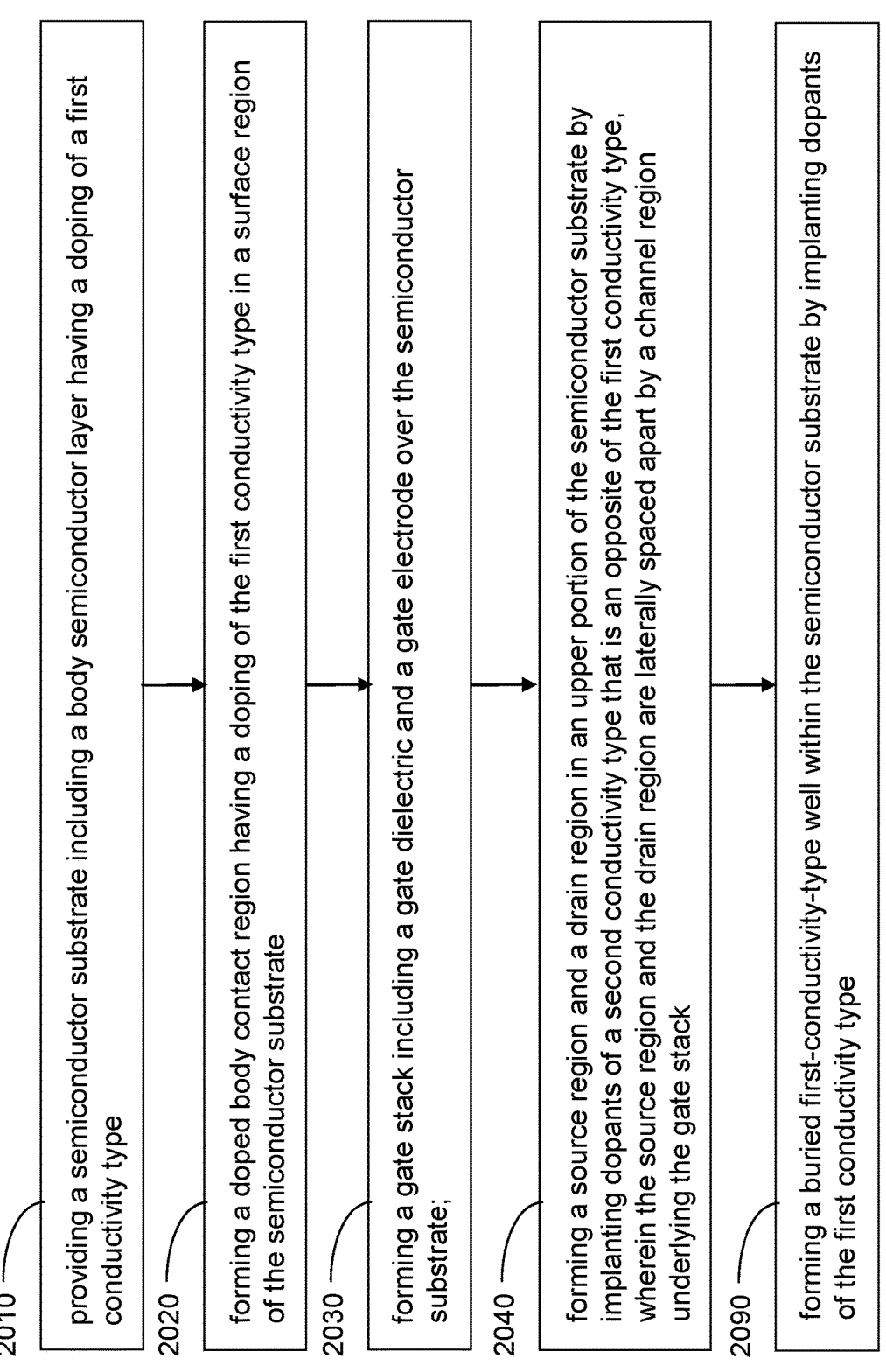
FIG. 20D is a fourth flow chart illustrating steps for forming an avalanche-protected field effect transistor of the present disclosure according to an embodiment of the present disclosure.

Generally, the various embodiments of the present disclosure illustrate methods of forming a semiconductor structure. Referring to step 2010, a semiconductor substrate 8 including a body semiconductor layer 709 having a doping of a first conductivity type may be provided, for example, as illustrated in FIG. 1A. Referring to step 2020, a doped body contact region 731 having a doping of the first conductivity type may be formed in a surface region of the semiconductor substrate 8, for example, as illustrated in FIGS. 1C, 2A and 2B, 3, 4, 5A, 5B, 6, 7, 8, 9A, 10, 11, 13, 14, 15, and 16. Referring to step 2030, a gate stack structure (752, 754, 758, 756) including a gate dielectric 752 and a gate electrode 754 may be formed over the semiconductor substrate 8, for example, as illustrated in FIGS. 1D, 2A and 2B, 3, 4, 5A, 5B, 6, 7, 8, 9A, 10, 11, 13, 14, 15, and 16. Referring to step 2040, a source region (732, 734) and a drain region (736, 738) may be formed in an upper portion of the semiconductor substrate 8 by implanting dopants of a second conductivity type that is an opposite of the first conductivity type, for example, as illustrated in FIGS. 1F, 2A and 2B, 3, 4, 5A, 5B, 6, 7, 8, 9A, 10, 11, 13, 14, 15, and 16. The source region (732, 734) and the drain region (736, 738) may be laterally spaced apart by a channel region 735 underlying the gate stack structure (752, 754, 758, 756). Step 2090 may be performed between step 2010 and step 2020 as illustrated in FIG. 20A, between step 2020 and step 2030 as illustrated in FIG. 20B, between step 2030 and step 2040 as illustrated in FIG. 20C, or after step 2040 as illustrated in FIG. 20D. At step 2090, a buried first-conductivity-type well 711 may be formed within the semiconductor substrate 8 by implanting dopants of the first conductivity type prior to, between, or after, processing steps used for formation of the gate stack structure (752, 754, 758, 756), the source region (732, 734), the drain region (736, 738), and the doped body contact region 731. For example, formation of the buried first-conductivity-type well 711 may be performed in, but is not limited to, any of the processing steps as illustrated in FIGS. 1B, 1C, 2A and 2B, 3, 4, 5A, 5B, 6, 7, 8, 9A, 9B, 9C, 10, 11, 13, 14, 15, and 16. The buried first-conductivity-type well 711 has an areal overlap with the drain region (736, 738) in a plan view, and is vertically spaced apart from the drain region (736, 738), and has a higher atomic concentration of dopants of the first conductivity type than the body semiconductor layer 709.

Generally, the bottom portion of the p-n junction between the drain region (736, 738) and an underlying p-doped semiconductor material (which may comprise a laterally-extending portion of the body semiconductor layer 709 or a drain-side first-conductivity-type well 723) breaks down during an avalanche breakdown condition while the sidewall portion of the p-n junction does not break down. In this configuration, the hot spot for impact ionization occurs not at the sidewall portion of the p-n junction, but at the bottom surface of the p-n junction. Because the bottom surface of the p-n junction is vertically spaced from the gate dielectric 752, permanent damage to the gate dielectric 752 may be avoided by in the avalanche-protected field effect transistor 800 of the present disclosure.

Generally, global bottom breakdown implant process used to form the first through fourth exemplary structures is easy and effective. An additional implant underneath the gate stack structure (752, 754, 758, 756) may change potential contour distribution, which means that bottom breakdown implant optimization will also impact the electrical field at the gate edge and may limit device unclamped inductive switching (UIS) capability improvement. According to an embodiment of the present disclosure, local bottom breakdown implant may be used to form any of the fifth through sixteenth exemplary structures. Local bottom breakdown implant may be deep or shallow. The resulting breakdown value may be much lower or slightly lower than device surface breakdown value. The depth, the lateral extent, and the dopant concentration profile in the buried first-conductivity-type well 711 may be optimized based on the application. In some embodiments, local bottom avalanche breakdown provided by a buried first-conductivity-type well 711 having a limited lateral extend may improve repetitive avalanche energy ($E_{AR}$) capabilities and/or single pulse avalanche energy ($E_{AS}$) capabilities of the avalanche-protected field effect transistor 800.

The various embodiments of the present disclosure provide an avalanche-protected field effect transistor having superior device characteristics during avalanche breakdown through use of a buried first-conductivity-type well 711 as a conductive path during avalanche breakdown of the field effect transistor, and by inducing impact ionization at a bottommost surface of a drain region (736, 738) instead of a sidewalls of the drain region (736, 738). The buried first-conductivity type well 711 may provide a conductive path for charge carriers under an avalanche condition that is alternative to channel region 735 formed under the gate structure 750. By providing the alternative conductive path, the various embodiments may dramatically improve device avalanche ruggedness. Damage that may occur in at a gate edge in a conventional device during avalanche conditions may be moved away from the gate edge in embodiment devices that include a buried first-conductivity type well 711.

Various embodiments described above may include a field effect transistor. The field effect transistor may comprise: a body semiconductor layer 709 located in a semiconductor substrate 8 and having a doping of a first conductivity type; a source region (732, 734) and a drain region (736, 738) formed in an upper portion of the semiconductor substrate 8, having a doping of a second conductivity type that is an opposite of the first conductivity type, and laterally spaced apart by a channel region 735; a doped body contact region 731 formed in the upper portion of the semiconductor substrate 8, having a doping of the first conductivity type, and spaced from the source region (732, 734); and a buried first-conductivity-type well 711 located within the semiconductor substrate 8, underlying, and having an areal overlap in a plan view with, the drain region (736, 738), vertically spaced apart from the drain region (736, 738), and having a higher atomic concentration of dopants of the first conductivity type than the body semiconductor layer 709.

In other embodiments, a semiconductor chip 900 may comprise at least one avalanche-protected field effect transistor 800 located in a semiconductor substrate 8. Each of the at least one avalanche-protected field effect transistor 800 comprises: a body semiconductor layer 709 located in a semiconductor substrate 8 and having a doping of a first conductivity type; a source region (732, 734) and a drain region (736, 738) formed in an upper portion of the semiconductor substrate 8, having a doping of a second conductivity type that is an opposite of the first conductivity type, and laterally spaced apart by a channel region 735; and a buried first-conductivity-type well 711 located within the semiconductor substrate 8, underlying, and having an areal overlap in a plan view with, the drain region (736, 738), vertically spaced apart from the drain region (736, 738) (by a laterally-extending portion of the body semiconductor layer 709 or by a drain-side first-conductivity-type well 723), and having a higher atomic concentration of dopants of the first conductivity type than the body semiconductor layer 709. Each of the at least one avalanche-protected field effect transistor 800 has a configuration that induces more than 90% of impact ionization electrical charges during avalanche breakdown to flow from the source region (732, 734), to pass through the buried first-conductivity-type well 711, and to impinge on a horizontal surface of a p-n junction that is a bottom surface of the drain region (736, 738), and less than 10% of the electrical charges to impinge on a sidewall surface of the p-n junction.

In other embodiments, a method of forming a semiconductor structure may be provided. The method may include the operations of providing a semiconductor substrate 8 including a body semiconductor layer 709 having a doping of a first conductivity type. The method may include the operation of forming a doped body contact region 731 having a doping of the first conductivity type in a surface region of the semiconductor substrate 8. The method may include the operations of forming a gate stack structure 750 (752, 754, 756, 758) including a gate dielectric 752 and a gate electrode 754 over the semiconductor substrate 8. The method may include the operations of forming a source region (732, 734) and a drain region (736, 738) in an upper portion of the semiconductor substrate 8 by implanting dopants of a second conductivity type that is an opposite of the first conductivity type, wherein the source region (732, 734) and the drain region (736, 738) are laterally spaced apart by a channel region (735) underlying the gate stack structure 750 (752, 754, 756, 758). The method may include the operations of forming a buried first-conductivity-type well 711 within the semiconductor substrate 8 by implanting dopants of the first conductivity type prior to, between, or after, processing steps used for formation of the gate stack structure 750, the source region (732, 734), the drain region (736, 738), and the doped body contact region 731, wherein the buried first-conductivity-type well 711 has an areal overlap with the drain region (732, 734) in a plan view, and is vertically spaced apart from the drain region (732, 734), and has a higher atomic concentration of dopants of the first conductivity type than the body semiconductor layer 709.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising providing a semiconductor substrate including a body semiconductor layer having a doping of a first conductivity type;

doping a first surface region of the semiconductor substrate into a doped body contact region having a doping of the first conductivity type;

doping a second surface portion of the semiconductor substrate into a source-side first-conductivity-type well, wherein the source-side first-conductivity-type well has a higher atomic concentration of dopants of the first conductivity type than the body semiconductor layer;

forming a drain extension region by implanting dopants a second conductivity type into another surface region of the semiconductor substrate, the second conductivity type being an opposite of the first conductivity type;

depositing and patterning a gate dielectric layer and a gate electrode layer to form a gate stack structure including a gate dielectric and a gate electrode over the semiconductor substrate after formation of the drain extension region;

converting a portion of the source-side first-conductivity-type well into a source extension region by implanting additional dopants of the second conductivity type using an ion implantation mask that comprises the gate stack structure;

implanting further additional dopants of the second conductivity type in an upper portion of the semiconductor substrate, wherein a source region and a drain region that are laterally spaced apart by a channel region underlying the gate stack structure is formed, and wherein the source-side first-conductivity-type well is in direct contact with the source region; and implanting dopants of the first conductivity type prior to, between, or after, processing steps used for formation of the gate stack structure, the source region, the drain region, and the doped body contact region, whereby a buried first-conductivity-type well within the semiconductor substrate is formed, wherein the buried first-conductivity-type well has an areal overlap with the drain region in a plan view, and is vertically spaced apart from the drain region, and has a higher atomic concentration of dopants of the first conductivity type than the body semiconductor layer.

2. The method of claim 1, wherein the buried first-conductivity-type well is formed by performing an ion implantation process prior to formation of the gate stack structure, and has an areal overlap with an entirety of the source region, the drain region, and the doped body contact region in a plan view.

3. The method of claim 1, wherein the buried first conductivity-type well is formed by performing an ion implantation process after formation of the gate electrode, and has an areal overlap with the drain region, and does not have an areal overlap with the doped body contact region in a plan view.

4. A method of forming a field effect transistor, the method comprising:

providing a semiconductor substrate containing a body semiconductor layer having a doping of a first conductivity type;

forming a buried first-conductivity-type well within the semiconductor substrate;

forming a source region and a drain region in an upper portion of the semiconductor substrate, wherein the source region and the drain region have a doping of a second conductivity type that is an opposite of the first conductivity type, and are laterally spaced apart from each other by a channel region, and wherein the buried first-conductivity-type well underlies, and has an areal overlap with, the drain region, is vertically spaced apart from the drain region, and has a higher atomic concentration of dopants of the first conductivity type than the body semiconductor layer;

forming a doped body contact region in the upper portion of the semiconductor substrate, wherein the doped body contact region has a doping of the first conductivity type, and is spaced from the source region; and forming a source-side first-conductivity-type well within the semiconductor substrate, wherein the source-side first-conductivity-type well is in direct contact with the source region and has a higher atomic concentration of dopants of the first conductivity type than the body semiconductor layer.

5. The method of claim 4, wherein the source-side first-conductivity-type well provides a first p-n junction having a periphery located entirely within a top surface of the semiconductor substrate.

6. The method of claim 5, wherein the source-side first conductivity-type well is in direct contact with the body semiconductor layer along an interface that extends from the top surface of the semiconductor substrate to a top surface of the buried first-conductivity-type well.

7. The method of claim 5, wherein the drain region forms a second p-n junction with the body semiconductor layer or a drain-side first-conductivity-type well that overlies the buried first-conductivity-type well and has a lower atomic concentration of dopants of the first conductivity type than the buried first-conductivity-type well.

8. The method of claim 4, wherein the source-side first-conductivity-type well connects the doped body contact region and a planar top surface of the buried first-conductivity-type well.

9. The method of claim 4, further comprising forming a gate dielectric over the channel region, wherein the channel region laterally extends through an upper portion of the source-side first-conductivity-type well and through an upper portion of the body semiconductor layer.

10. The method of claim 4, wherein the source-side first conductivity type well is laterally spaced from the buried first-conductivity-type well by a portion of the body semiconductor layer that underlies a gate dielectric.

11. The method of claim 4, wherein the source region and the drain region are formed with asymmetric extension regions such that a drain extension region has a greater areal overlap with a gate electrode in the plan view than a source extension region has with the gate electrode in the plan view.

12. The method of claim 4, wherein the buried first-conductivity-type well, the source region, the drain region, and the doped body contact region are formed such that the buried first-conductivity-type well has an areal overlap with an entirety of areas of the source region, the drain region, and the doped body contact region in the plan view.

13. The method of claim 4, further comprising forming a shallow trench isolation structure in the semiconductor substrate, wherein the shallow trench isolation structure laterally surrounds the source region, the drain region, and the doped body contact region, and wherein an entirety of a closed periphery of an interface between a top surface of the buried first-conductivity-type well and the body semiconductor layer contacts sidewalls of the shallow trench isolation structure.

14. The method of claim 4, wherein the buried first-conductivity-type well, the drain region, and the doped body contact region are formed such that the buried first-conductivity-type well has an areal overlap with an entirety of an area of the drain region in the plan view, and does not overlap with an area of the doped body contact region in the plan view.

15. The method of claim 4, further comprising forming a buried second-conductivity-type well in the semiconductor substrate, wherein the buried second-conductivity-type well underlies the buried first-conductivity-type well and forms an additional p-n junction with the buried first-conductivity-type well.

16. A method of forming a semiconductor structure, comprising:

providing a semiconductor substrate containing a body semiconductor layer having a doping of a first conductivity type;

forming a buried first-conductivity-type well within the semiconductor substrate;

forming a source region and a drain region in an upper portion of the semiconductor substrate, wherein the source region and the drain region have a doping of a second conductivity type that is an opposite of the first conductivity type, and are laterally spaced apart from each other by a channel region;

forming a doped body contact region in the upper portion of the semiconductor substrate, wherein the doped body contact region has a doping of the first conductivity type, and is spaced from the source region; and forming a source-side first-conductivity-type well within the semiconductor substrate, wherein the source-side first-conductivity-type well is in direct contact with the source region to provide a first p-n junction having a periphery located entirely within a top surface of the semiconductor substrate, in direct contact with the body semiconductor layer along an interface that extends from the top surface of the semiconductor substrate to a top surface of the buried first-conductivity-type well, and having a higher atomic concentration of dopants of the first conductivity type than the body semiconductor layer.

17. The method of claim 16, wherein the buried first-conductivity-type well has an areal overlap in a plan view with, the drain region, is vertically spaced apart from the drain region, and has a higher atomic concentration of dopants of the first conductivity type than the body semiconductor layer.

18. The method of claim 16, wherein the source-side first-conductivity-type well is formed with a higher atomic higher atomic concentration of dopants of the first conductivity type than the body semiconductor layer by implantation of dopants of the first conductivity type.

19. The method of claim 16, wherein the source-side first-conductivity-type well connects the doped body contact region and the buried first-conductivity-type well within each of the at least one avalanche-protected field effect transistor.

20. The method of claim 16, further comprising forming a buried second-conductivity-type well on the semiconductor substrate, wherein the buried second-conductivity-type well underlies, and forms an additional p-n junction with, the buried first-conductivity-type well.

\* \* \* \* \*